United States Patent
Matsumura et al.

(10) Patent No.: US 9,147,016 B2
(45) Date of Patent: Sep. 29, 2015

(54) MULTI-ECU SIMULATION BY USING 2-LAYER PERIPHERALS WITH LOOK-AHEAD TIME

(75) Inventors: Ikuo Matsumura, Yamato (JP); Shuichi Shimizu, Tokyo (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 284 days.

(21) Appl. No.: 13/817,597

(22) PCT Filed: Jul. 27, 2011

(86) PCT No.: PCT/JP2011/067132
§ 371 (c)(1),
(2), (4) Date: Feb. 19, 2013

(87) PCT Pub. No.: WO2012/023397
PCT Pub. Date: Feb. 23, 2012

(65) Prior Publication Data
US 2013/0151220 A1    Jun. 13, 2013

(30) Foreign Application Priority Data
Aug. 20, 2010 (JP) ................. 2010-184845

(51) Int. Cl.
G06F 17/50 (2006.01)
G06F 11/26 (2006.01)
G05B 17/02 (2006.01)

(52) U.S. Cl.
CPC .......... *G06F 17/5009* (2013.01); *G06F 11/261* (2013.01); *G05B 17/02* (2013.01)

(58) Field of Classification Search
CPC ............. G06F 17/50; G06F 9/44; G06F 9/38; G06F 13/00; G06F 17/40; G06F 17/10; G06G 7/48; G01R 31/00; H04L 9/32

USPC .................. 703/8, 13, 19; 711/107; 712/241; 701/33.4; 713/2
See application file for complete search history.

(56) References Cited

U.S. PATENT DOCUMENTS 5,737,711 A * 4/1998 Abe ............................. 701/33.4
2005/0125211 A1   6/2005 Nahata et al.
(Continued)

FOREIGN PATENT DOCUMENTS

CN           1601474 A     3/2005
CN           1609808 A     4/2005
(Continued)

*Primary Examiner* — Kandasamy Thangavelu
(74) *Attorney, Agent, or Firm* — Jeff Tang

(57) ABSTRACT

A method and system where a plurality of ECU is rapidly executed while avoiding deadlock by performing conservative event synchronization. The simulation system is provided with 4 layers, namely a processor emulator which is an ECU emulator, a plant simulator, a external peripheral scheduler, and a mutual peripheral scheduler. The external peripheral scheduler performs advanced execution of the plant simulator only during processor emulator reaction delay time (or the time until the next event). The notification to perform advanced execution of the plant simulator is provided until the actual plant simulator stop time. The mutual peripheral scheduler provides notification to the processor emulator to perform advanced execution only during communication delay timing between processor emulators (or the time until the next event). The processor emulator conservatively processes until the earliest time of the notification times. Each peripheral scheduler proceeds with processing until the earliest time of the accepted events.

21 Claims, 23 Drawing Sheets

(56) References Cited

U.S. PATENT DOCUMENTS

| | | | |
|---|---|---|---|
| 2009/0306952 A1* | 12/2009 | Kajitani et al. | 703/13 |
| 2010/0070748 A1* | 3/2010 | Duan et al. | 713/2 |
| 2010/0138810 A1* | 6/2010 | Komatsu et al. | 717/107 |
| 2010/0299509 A1* | 11/2010 | Doi et al. | 712/241 |
| 2010/0305926 A1* | 12/2010 | Canedo et al. | 703/8 |
| 2011/0015916 A1* | 1/2011 | Kataoka et al. | 703/19 |

FOREIGN PATENT DOCUMENTS

| | | |
|---|---|---|
| GB | 2486136 A | 6/2012 |
| JP | 10-312315 | 11/1998 |
| JP | 2002-073374 | 3/2002 |
| JP | 2003-216678 | 7/2003 |
| JP | 2004206699 A | 7/2004 |
| JP | 2007-117020 | 11/2008 |
| JP | 2010-002968 | 1/2010 |

\* cited by examiner (1) Inquiry from processor (2) Signaling from processor to plant Notification of status change from plant to processor OQ (output queue, FIFO)
Message transmission
Message reception
IQ (input queue, FIFO)
Current time (scholar value)
Task queue TQ (chronological sort)

Communication channel

Configuration of LP group

Processor communication delay $\Delta T_c$

Reaction delay of processor ΔT<sub>R</sub>

Configuration where 3 processors Pr1,
Pr2, Pr3 share memory

MULTI-ECU SIMULATION BY USING 2-LAYER PERIPHERALS WITH LOOK-AHEAD TIME

CROSS-REFERENCE TO RELATED APPLICATION

This application is a National Phase Application based on PCT/JP2011/067132 which claims priority from Japanese Patent Application No. 2010-184845 filed Aug. 20, 2010, the entire contents of both of which are incorporated herein by reference

BACKGROUND OF THE INVENTION

1. Field of the Invention

The present invention relates to simulation of a physical system such as an automobile, and more specifically relates to a computer implemented simulation system.

2. Description of Related Art

Early in the 20th century, the automobile was made of mechanical components including engine for power, accelerator, steering wheel, transmission, and suspension, but almost no electrical devices were used other than the engine spark plugs and the headlights.

However, since the 1970s, there has been a need to control engine efficiency as a result of air pollution and oil crises, and therefore at ECU is used for controlling the engine. Generally, the ECU has an input interface that performs A/D conversion of an input signal from a sensor for example, a logical operator (microcomputer) that processes the digital input signal in accordance with established logic, and an output interface that converts the processed results to an actuator operating signal.

Nowadays, modern automobiles contain not only mechanical components, but electronic components and software occupy a significant share, extending not only to engine and transmission control systems, antilock braking system (ABS), electronic stability control (ESC), and power steering, but even extending to windshield wiper control and security of monitoring systems and the like. The development costs for these components are said to be from 25 to 40% of the total cost, and account for 70% for a hybrid vehicle.

Incidentally, automobiles contain a power device such as an engine, power transferring device, driving device for steering or the like, braking device, and other mechanical members for other body systems (plant), and the operations of these plants are dynamically determined by programs of 30 to 70 or more electronic control units (ECU) based on sensor input (speed or the like) and input from humans (accelerator and the like).

An ECU basically controls the operation of each individual plant. For example, an engine control unit uses software to determine the amount and timing for fuel injection and ignition of the engine. For high-grade vehicles such as those provided with a "sport" mode, the amount of fuel injected can be either increased or decreased depending on the mode by using software. Furthermore, the rotational speed of the engine can be made to match the timing for shifting down by the automatically blipping (racing) the engine. In this case, the engine ECU and the transmission ECU must operate in a cooperative manner. With an integrated vehicle position stabilizing device (ESC: Electronic stability control) for preventing lateral slipping or the like of the vehicle, coordination with the braking device such as the brakes or the like is essential, and thus ECU software is complex. Note, this type of "intervention" function is primarily software, and can easily be cut.

In order to sufficiently achieve the function of the plant and to operate stably, tuning and testing of the operating parameters must be sufficiently performed in the process of designing and developing the ECU software. Tuning and testing is repeatedly performed after a prototype is made of an actual vehicle, but because of cost and timing constraints, there is strong demand for a method that virtually achieves a controller and plant in a calculating device prior to prototyping, and thus the operation can be quickly and accurately performed. This ECU simulation includes 4 types, namely: (1) Model-in-the-Loop Simulation (MILS) that logically expresses the operation of the controller using an expression format such as a state machine; (2) Software-in-the-Loop Simulation (SILS) where some hardware control such as data precision is introduced to the logical operation; (3) Processor-in-the-Loop Simulation (PILS) and Virtual Hardware-in-the-Loop Simulation (V-HILS) where the software is completely packaged to emulate the ECU processor; and (4) Hardware-in-the-Loop Simulation where the ECU board is completely packaged and connected with a real-time plant simulation, used in this order to approach the prototype.

MILS and SILS are primarily used during the trial and error phase in order to achieve basic performance of the plant. However, the operation differs from the software that is actually included in the ECU, so use for product verification applications is not possible. On the other hand, V-HILS uses completed ECU software, and is extremely promising as a method for resolving unanticipated actions (bugs) that are discovered in the software, but there are no examples where an operation with reproducibility has been achieved. HILS is always performed in order to confirm the final behavior of the completed ECU board, but reproducibility is not insured even if a failure is discovered and therefore cannot be used for the purpose of debugging.

The reason that the operation cannot be reproduced using HILS is not because the configuration of HILS is incomplete, but rather because all of the ECU's are mutually connected together by a network such as CAN or the like. Generally, a network provides loose coupling between modules, so the order of data arrival will vary based on slight differences in timing of the module operation, and as a result the behavior of the entire system will vary. Therefore, even if the actual vehicle is prototyped, reproducibility of the operation cannot be expected. This is the same reason that debugging a parallel distributed system is extremely difficult.

With this type of HILS configuration, or in other words with a configuration where the ECU board and the plant simulator were loosely linked, operation consistency cannot be achieved even if each of the components are sped up. Achieving consistency in the order of communication is necessary in order to achieve reproducibility of the operation. V-HILS is expected to resolve this problem in particular.

According to traditional concepts, a typical V-HILS configuration includes a plurality of ECU emulators, a plurality of plant simulators, and a global scheduler that schedules all operations.

The ECU emulator includes a processor emulator and a peripheral emulator. On the other hand, the plant simulator includes a brake simulator and an engine simulator and the like.

At this time, the processor emulator operates using a relatively high resolution clock at 80 MHz for example. On the other hand, the plant simulator is a simulator of a physical mechanism, and therefore operates at a relatively low resolution of 10 kHz for example. Generally, a lower resolution can be simulated at high speed, so the plant simulator is often faster.

The plant simulator does not necessarily repeat calculations of values at processing step times that have a fixed length, and usually there is a need to suppress the effects of calculation differences and to have a variable step that is based on the timing of noncontiguous change points. Instruction signals are received from the controller in each step, and the internal state is output to each sensor. Note, the instruction signal is usually a pulse for expressing the on or off condition of a switch.

The peripheral emulator is mutually connected to the plant simulator and the processor emulator using the I/O interface of the ECU emulator. Typically, the operations can be suppressed at a resolution of approximately 10 MHz. This increases the speed of the plant simulator, but decreases the speed of the processor emulator. The peripheral emulator transmits a pulse signal to the plant simulator. Furthermore, the internal state from the plant simulator is read as quantized data.

The peripheral emulator receives a read write (R/W) request and transmits and receives data with the processor emulator, and sends interruptions (INT). In particular, with the function of a network such as a CAN (controller area network) that mutually connects between processors, transmission data is received from the processor (W) and communication between peripherals is performed through a bus, and when the data is received, an interrupt (INT) is sent to the processor, and the data received from the processor is read based on a request (R).

Looking from one side, the peripherals are the center of the system and mutually connected between the plant and the processor and between processors. If there is only sufficient time resolution to mutually distinguish the order of the signals that pass through the peripherals, the order can be properly reproduced for synergistic effects between the plant and the processor. If the time until the next signal determines the degree of precision (calculation rate and the like), a finer time resolution is favorable. In other words, the size of the data error is determined by the time resolution.

There is also a problem with overhead in addition to the problem with data error. In other words, with a method that provides a fixed synchronous interval, a more proper operation can be achieved if the synchronous interval is shortened, but conversely, the overhead required for synchronous processing will increase, so the time for all processes will increase.

An approach where the synchronous interval is fixed and reduced to the maximum limit cannot be a method for practically resolving both aspects of data error and overhead.

With V-HILS, the synchronous problem is critical, and when organized, the following three methods are conceivable:

(1) Time synchronization: With this method, the processor emulator executes the simulation while mutually communicating. There is a trade-off between execution speed and time precision, and there are quantization errors for time. Furthermore, as described above, with this method, the synchronous communication cost is higher between the processor emulators, so the practical resolution is not achieved.

(2) Optimistic event synchronization: With this method, each processor and emulator synchronizes with the other party by sending or receiving an event with time information. However, speculated simulation is executed while retaining the possibility of "flying", so if the speculation causes out of order state, the processor and emulator must be rolled back appropriately. The cost of synchronization is smaller than with the time synchronization method, but the cost of successively recording the status in preparation of rollback is too high, and is not practical.

(3) Conservative event synchronization: With this method, each processor and emulator synchronizes with the other party by sending or receiving an event with time information. However, the simulation proceeds "conservatively" so a cause and effect relationship does not conflict, and therefore mutual events will be held, and a deadlock can occur. In order to avoid this type of deadlock, a special null message or the like is sent at high frequency in order to perform a time send, and thus the cost of avoidance is high.

As conventional technology for V-HILS, Japanese unexamined patent application 2007-11720 discloses that an issue to be resolved is to enable flexible variation of the configuration of a system simulator while accommodating systems with complex configurations, and that a system simulator includes 3 types, namely an instruction set simulator that simulates CPU operation, a bus simulator that simulates bus operation, and a peripheral simulator that simulates the peripheral operations, with an interface provided between each simulator that can reference and change the mutual state. However, this conventional technology does not suggest a technique of optimizing synchronization between peripherals and the CPU.

The present inventors developed a mechanism for conservative event synchronization and provided a simulation technique that used a peripheral scheduler as disclosed in the specification of UK patent application GB2486136A. With this technique, the peripheral scheduler begins parallel operation by the canceling (OFF) all peripheral emulator completion flags. Furthermore, the peripheral scheduler finds the peripheral emulator scheduled to face the earliest processing break, based on the timing of the processing break of each individual peripheral emulator that is set. This is referred to as peripheral P. If the time of that processing break is T, the peripheral scheduler proceeds with execution of each processor emulator and each plant simulator until the time reaches time T. Therefore, the peripheral scheduler waits for the peripheral P completion flag to be set. In response to setting of the peripheral P completion flag, the peripheral scheduler synchronizes the data between the peripherals P, the processor emulator, and the plant simulator.

However, recently there has been demand for simulation that more closely approaches the overall operation of the actual device such as simultaneously emulating a plurality of ECUs with a multicore host computer. The execution speed will vary for each of the hosts of a plurality of ECU, and therefore explicit synchronous processing is required there between. However communication that regularly interrupts is performed between the ECUs so synchronizing the plurality of ECU is not easy. The technique disclosed in the specification of Japanese patent application 2009-238954 is applicable only for a single ECU, so this technique cannot be applied without modification to simulations of systems that have a plurality of ECU.

SUMMARY OF THE INVENTION

According to a first embodiment, a computer implemented simulation system that performs simulation is provided. The system includes a plurality of processor emulators that run on the computer, a plurality of plant simulators that run on the computer, an external peripheral scheduler that runs on the computer, where the external peripheral scheduler (i) first runs the plant simulator until the reaction delay time of the processor emulator, and (ii) provides notification through the peripheral emulator to run before the processor emulator until the simulator stop time, and a mutual peripheral scheduler that runs on the computer and provides notification for running in advance of the processor emulator only for the communication delay time with the processor emulator, where the processor emulator performs conservative processing until the notification time.

According to a second embodiment, a computer implemented simulation method that performs simulation is provided. The method includes executing the plurality of processor emulators on the computer, executing the plurality of plant simulators on the computer, executing an external peripheral on the computer, where executing an external peripheral (i) first runs the plant simulator until the reaction delay time of the processor emulator, and (ii) provides notification through the peripheral emulator to run before the processor emulator until the simulator stop time, and executing the a mutual peripheral scheduler that runs on the computer and provides notification for running in advance of the processor emulator only for the communication delay time with the processor emulator, where the processor emulator conservatively proceeds until the notification time.

According to a third embodiment, a computer readable storage medium tangibly embodying a computer readable program code having computer readable instructions which, when implemented, cause a computer to carry out the steps of a method, is provided. The method includes executing the plurality of processor emulators, executing the plurality of plant simulators, executing an external peripheral and first running the plant simulator until the reaction delay time of the processor emulator, and providing notification through the peripheral emulator to run before the processor emulator until the simulator stop time and executing a mutual peripheral scheduler that runs on the computer and provides notification for running in advance of the processor emulator only for the communication delay time with the processor emulator, where the processor emulator performs conservative processing until the notification time.

BRIEF DESCRIPTION OF THE DRAWINGS

FIG. 26 is a diagram of a flowchart for the operation of an external peripheral scheduler that passively uses a passive plant simulator.

DETAILED DESCRIPTION OF THE PREFERRED EMBODIMENTS

Figure 1:
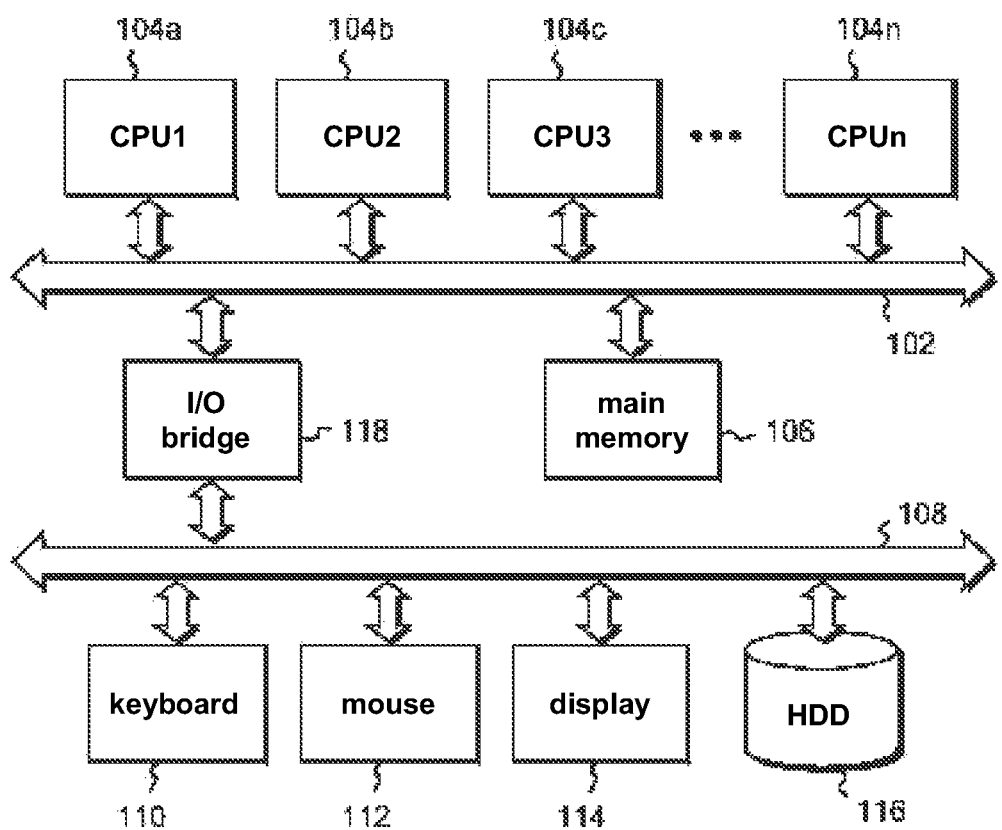
FIG. 1 is a block diagram illustrating an example of computer hardware that is used for performing the present invention.

It is an object of the present invention to provide a technique that can execute a fast simulation with sufficient time precision and minimal data error for a system with a plurality of ECU and plants that mutually provide notification (interrupt) of asynchronous data. Notification of asynchronous data refers to notifying a controller of a regular state change of a plant, or asynchronous CAN communication between processors.

It is another object of the present invention to link three types of processor emulators, peripheral emulators, and plant simulators in order to simulate an entire system with an ECU and a plant subject to control thereof.

With the present invention, the peripherals are divided into three types, namely mutual peripherals, external peripherals, and internal peripherals, and a scheduler unique to each is provided. These three types of schedulers cooperate and efficiently achieve accurate linked operations.

The mutual peripherals are an intermediate layer that processes communication between processors, and have a unique mutual peripheral scheduler. Mutual peripherals have a function that performs high-speed processing of asynchronous communication between processors.

External peripherals are an intermediate layer that communicate between the plants and the processors, and have a unique external peripheral scheduler. External peripherals have a function of receiving asynchronous notification from the plant and transferring to the processor, and transmitting instructions from the processor to the plants.

The internal peripherals are a peripheral layer that are connected only to specific processors, and correspond to watchdog timers and memory and the like for example. Signals are not exchanged with the plants and other processors. The internal peripherals have an internal peripherals scheduler (or processor scheduler).

The mutual peripheral scheduler, external peripheral scheduler, and internal peripherals scheduler operate in parallel with a co-routine form.

Note that the plant simulator is preferably created by a continuous value simulation modeling system such as MATLAB®/Simulink®. The peripheral emulator is a transaction type emulator, and is preferably created by SystemC/TLM. The processor emulator performs emulation using a instruction set simulator (ISS).

The external peripheral scheduler selects the earlier of either the "reaction delay time" of the processor emulator or the time being that the next event occurs, and performs advanced execution of the plant simulator until that time. Furthermore, all of the processor schedulers (or internal peripheral schedulers) are notified that the plant simulator will be performing advanced execution until the stop time. Note, the reaction delay time indicates the minimum time difference from acceptance of the notification of state change from the plant until instructions are calculated for the corresponding plant, and those actual instructions become effective in the plant.

The mutual peripheral scheduler selects the earlier of the "communication delay time" between the processor emulators, and the time being that the next event occurs, and provides notification to all of the processor schedulers (or internal peripheral schedulers) in order to perform advanced execution until that time. Note, the communication delay time refers to the minimum time required from transmission of data by the processor until the data is received by another processor.

The processor scheduler (or internal peripheral scheduler) proceeds with processing until the earliest timing of the target synchronous time that was notified. In this manner, deadlock between processors can be avoided at low cost by conservatively processing until the synchronous time provided by the two types of peripheral schedulers, without performing a time adjustment between processors.

Each peripheral layer receives the timing of the slowest progressing processor as an event, and self processing is performed until that time. The next synchronous time notification is determined based on the updated timing. In this manner, the simulation proceeds in order of plants, processor, and peripheral, and processing that links between different types overall is achieved.

In accordance with the present invention, the reaction delay time of the processor emulator and the communication delay time between processor emulators is used and speculative execution of the processor emulator is performed, so there is no overhead for avoiding deadlock, and rapid simulation is possible using conservative event synchronization. Furthermore, the synchronization method is based on an event that can express an arbitrary time rather than by synchronizing at fixed time intervals, so accurate simulation with minimal time related error is possible.

The configuration and process of an embodiment of the present invention is described below while referring to the drawings. In the following description, the same elements have been assigned the same codes across the drawings, unless otherwise noted. Note, the configurations and processes described herein are described as an example, and it should be understood that there is no intent to restrict the technical scope of the present invention to these embodiments.

First, the computer hardware that is used for performing the present invention is described while referring to FIG. 1. In FIG. 1, a plurality of CPU 1 104a, CPU 2 104b, CPU 3 104c, . . . CPUn 104n are connected together by a host bus 102. The host bus 102 is also connected to main memory 106 in order to perform the operations of the CPU 1 104a, CPU 2 104b, CPU 3 104c, . . . CPUn.

On the other hand, keyboard 110, mouse 112, display 114, and hard disk drive 116 are connected to an I/O bus 108. The I/O bus 108 is connected through an I/O bridge 118 to the host bus 102. The keyboard 110 and the mouse 112 are used for operations such as inputting commands and clicking a menu or the like. The display 114 is used for displaying menus for performing the processes as necessary using GUI.

IBM ®® System X is an example of the hardware of computer system that is favorably used for this objective. At this time, the CPU 1 104a, CPU 2 104b, CPU 3 104c, are an Intel ® Xeon ® for example, and the operating system is Windows (trademark) Server 2003. The operating system preferably has a multitask function. The operating system is stored in the hard disk drive 116, and is red from the hard disk drive 116 to the main memory 106 during startup of the computer system.

In order to perform the present invention, a multiprocessor system is preferably used. Herein, a multiprocessor system generally indicates a system that uses a processor with a plurality of cores with processor functions that can independently perform calculations, and therefore it should be understood that a multicore single processor system, single core multiprocessor system, or multicore multiprocessor system can be used.

Note that the hardware for a computer system that can be used for performing the present invention is not restricted to the IBM® System X, and any computer system that can run the simulation programs of the present invention can be used. The operating system is also not restricted to Windows (R), and any operating system can be used, such as Linux®, or Mac OS (R). Furthermore, in order to increase the operating speed of the simulation program, the operating system can be a computer system such as the AIX (trademark) of IBM (R) System P, based on Power (trademark) 6.

The hard disk drive 116 stores programs such as the processor emulator, peripheral emulator, plant simulator, internal peripheral scheduler, mutual peripheral scheduler, external peripheral scheduler, and CAN emulator and the like, and each of these is loaded into the main memory 106 during startup of the computer system, and is assigned to one of the CPU1 through CPUn and executed as an individual thread or process. Therefore, the computer system illustrated in FIG. 1 preferably has a sufficient number of CPU for allocation to each of the threads such as the processor emulator, peripheral emulator, plant simulator, mutual peripheral scheduler, external peripheral scheduler, CAN emulator, and the like.

Figure 2:
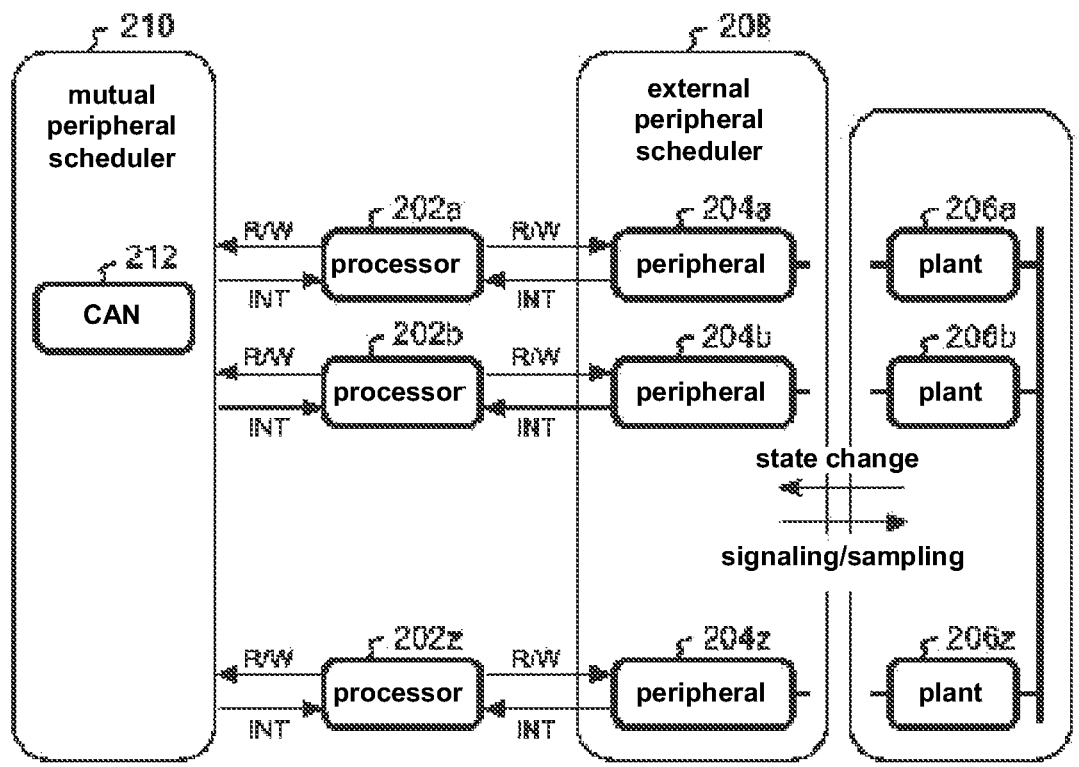
FIG. 2 is a diagram illustrating an embodiment of a function block for performing the present invention.

FIG. 2 is a function block diagram illustrating the cooperative relationship between processing programs such as the processor emulator, peripheral emulator, plant simulator, mutual peripheral scheduler, external peripheral scheduler, CAN emulator, and the like, that operate as individual threads or processes and are allocated to the individual CPU1 through CPUn.

This configuration is a simulation system containing a processor emulator corresponding to an ECU, a peripheral emulator, and a plant simulator. The peripheral emulator is divided into a mutual peripheral and an external peripheral. Note, although not illustrated in the diagram, the internal peripheral should be interpreted to be included in the processor emulator block. Overall, the four layer simulation system can be captured in the lateral direction of the drawing.

In FIG. 2, the processor emulators 202a, 202b, . . . 202z have a central function as a controller of the ECU functions in the simulation system. The processor emulators 202a, 202b, . . . 202z download the software code and perform emulation using a instruction set simulator (ISS).

The peripheral emulators 204a, 204b . . . 204z are transaction type emulators, and are preferably created by SystemC/TLM.

The plant simulators 206a, 206b, . . . 206z are preferably created by a continuous value simulation modeling system such as MATLAB®/Simulink®. Each of the plant simulators 206a, 206b, . . . 206z corresponds to a mechanical device in an automobile such as a power device like an engine or the like, a power transferring device such as a transmission, a driving device such as a steering wheel, and a braking device and the like.

The processor emulators 202a, 202b, . . . 202z typically operate using a relatively high resolution clock at 80 MHz for example. On the other hand, the plant simulators 206a, 206b, . . . 206z are simulators of a physical mechanism, and therefore typically operate at a relatively low resolution of 10 kHz for example.

Therefore, the processor emulators 202a, 202b, . . . 202z and the plant simulators 206a, 206b, . . . 206z cannot be directly connected, so peripheral emulators 204a, 204b, . . . 204z are provided there between, and thus the peripheral emulators play a roll such that the state change and sensor values from the plant simulators are converted to events and transferred to the processor emulators, or conversely instructions (signaling) from the processor emulators are converted to events and transferred to the plant simulators.

The internal peripheral scheduler performs scheduling of the processor emulators and the peripheral emulators connected thereto. The peripheral emulators that are connected to the processor emulators process peripheral (internal peripheral) functions that are not directly related to other processors and plants such as ROM, RAM, and watchdog timer and the like. The internal peripheral scheduler has important functions that divide load/store commands from the ISS to the internal peripheral scheduler, mutual peripheral scheduler, and external peripheral scheduler, in reference to the memory map specification of the ECU. Note, in the following, the internal peripheral scheduler is also described as the processor scheduler, but it should be noted that both names indicate the same function.

The external peripheral scheduler 208 is a scheduler that processes the peripheral emulators 204a, 204b, . . . 204z that are connected to the plant simulators 206a, 206b, . . . 206z. The external peripheral scheduler 208 performs scheduling in order to perform advanced execution of the plant simulators only during processor emulator reaction delay time (or the time until the next event). The plant simulator stops at a designated time, or at an earlier time if notification of updating the internal state is required. Furthermore, notification to perform advanced execution of the processor emulator is provided until the actual plant simulators 206a, 206b, . . . 206z stop time.

The external peripheral scheduler 208 provides instructions to the plant simulators 206a, 206b, . . . 206z for signaling or sampling that are requested by the controller. Signaling is an event where the controller actuates the plant, and an example is an operation of instructing the on/off signal of a switch. Furthermore, sampling is an event where the controller provides instructions to read a value when monitoring (sensing) the status of the plant and an example is an operation where the controller reads the voltage value of a battery cell (plant). The controller is software that is loaded to the processor emulator, and is logic that creates a control signal for the plant. The timing for signaling and sampling is determined by the controller, regardless of whether or not the processes are periodically performed for emulation.

On the other hand, the external peripheral scheduler 208 received notification of a state change event from the plant simulators 206a, 206b, . . . 206z. This is an event that notifies the controller that the plant has changed state, and the plant determines the timing thereof. This can occur regularly, or irregularly.

The mutual peripheral scheduler 210 is a scheduler that provides mutual peripheral functions that connect between the processor emulators 202a, 202b, . . . 202z. The mutual peripheral scheduler 210 provides notification in order to perform advanced execution of the processor emulators 202a, 202b, . . . 202z only during processor emulator 202a, 202b, . . . 202z communication delay time (or the time until the next event). The processor emulators 202a, 202b, . . . 202z conservatively process until the earliest time of the notification times. At this time, communication between the processor emulators is performed by a CAN (Controller Area Network) emulator 212. A simulation where shared memory is used for communicating between the processors of the ECU is described using FIG. 21.

As illustrated in FIG. 2, an event from the external peripheral scheduler 208 and the mutual peripheral scheduler 210 to the processor emulators 202a, 202b, . . . 202z is performed as an interrupt (INT), and an event from the processor emulators 202a, 202b, . . . 202z to the external peripheral scheduler 208 and the mutual peripheral scheduler 210 is performed as a read write (R/W).

In reference to FIG. 3, advanced execution that uses the delay in the processor emulators (or processor scheduler), mutual peripheral scheduler, external peripheral scheduler, and plant simulators is described as shown below.

Figure 3:
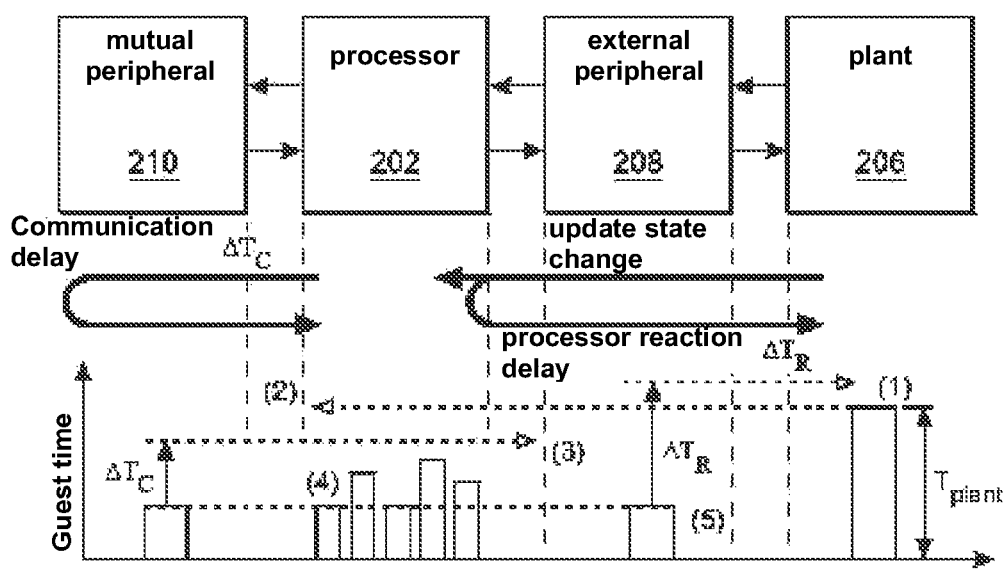
FIG. 3 is a diagram that describes the delay in the processor, peripheral, and plant.

First, as illustrated in FIG. 3 (1), the external peripheral scheduler 208 causes advanced execution of the plant simulator 206. The actual advanced time is $T_{plant}$.

The upper limit of the advanced time is at the following signaling or closer to $\Delta T_R$. Herein, $\Delta T_R$ is the minimum value of the delay from the input time from the plant simulator until the reaction of the processor emulator caused thereby is transferred to the plant simulator and made valid, but a more detailed description is provided in FIG. 20.

Next, as illustrated in FIG. 3 (2), the external peripheral scheduler 208 provides notification for advanced execution to the processor emulator 202 until the plant simulator 206 is actually at a stopped position ($T_{plant}$).

Next, as illustrated in FIG. 3(3), the mutual peripheral scheduler 210 provides notification to the processor emulator 202 to perform advanced execution until the earlier of the communication delay timing between processor emulators 202 and the time until the next event. The diagram illustrates an example where the communication delay time is earlier.

Figure 19:
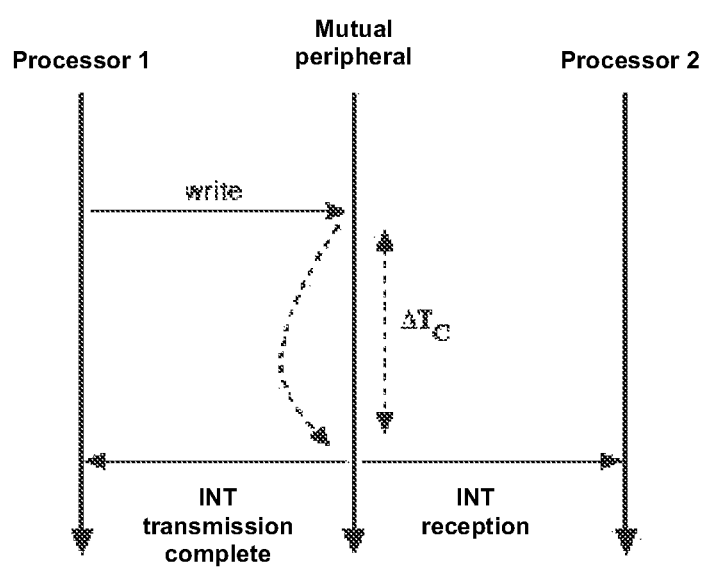
FIG. 19 is a diagram for describing the communication delay $\Delta T_c$ of the processor.

The communication delay time $\Delta T_c$ is described in further detail in FIG. 19.

Next, as illustrated in FIG. 3 (4), the processor emulator 202 proceeds with conservative processing until the earliest timing of the two notification times, but processing does not necessarily continue until this time without interruption, and for example this time will be temporarily stopped if there is a shared memory read (R). The diagram illustrates the situation of a temporary stop at time (4) prior to the process proceeding to time (3). If the shared memory is not accessed, processing will proceed at once to time (3).

As illustrated in FIG. 3 (5), the mutual peripheral scheduler and the external peripheral scheduler proceed with processing themselves until the earliest event received from the processor.

Figure 4:
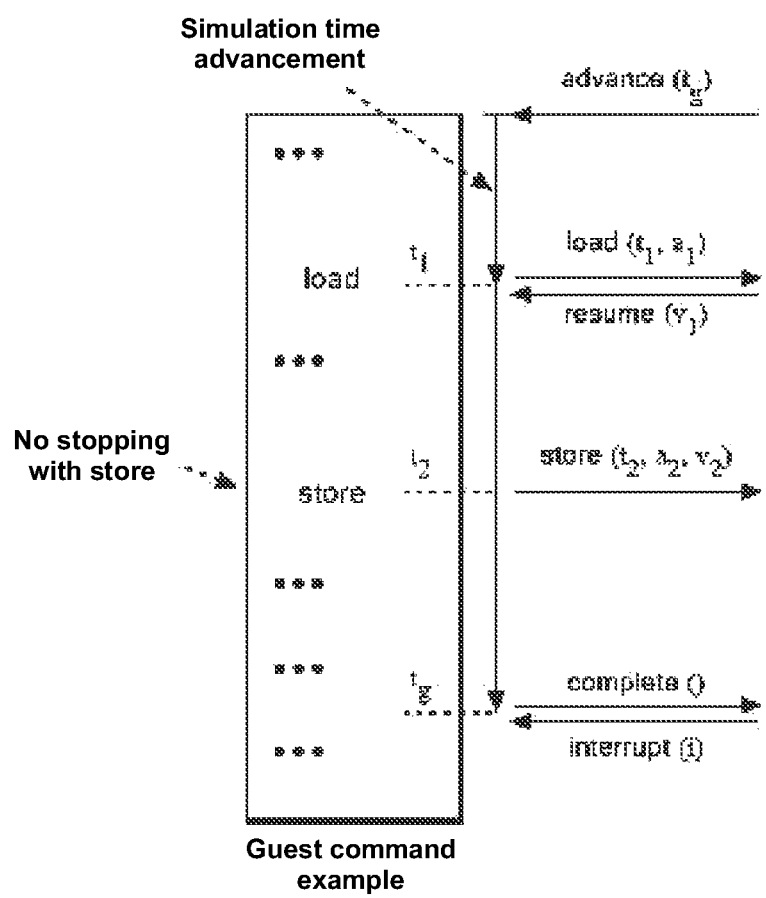
FIG. 4 is a diagram illustrating the function of processor emulation.

Next, in reference to FIG. 4, the emulation function of the processor is described. The processor emulation is achieved as ISS (instruction set simulator). The processor emulation is executed targeting the designated time, outputs a request for access (R/W) based on instructions (command language), or receives any regular interruption generated from a peripheral.

In this embodiment in particular, the instructions to the ISS and the requests from the ISS are recorded below in order to support the description.

Notifications And Instructions To ISS advance(t): Indicates to ISS to execute until time t at a maximum. However, if communication is necessary before reaching this time, the ISS will interrupt processing to output that request.

resume(v): Data corresponding to a read request is sent to the ISS to restart execution.

interrupt(i): The ISS is notified that an interruption i has occurred.

Requests And Notifications From ISS

Load (t, a): Requests reading of the data v at address a at time t. Later, the process is interrupted until receiving a resume notification.

store(t, a, v): Requests writing of the data at address a at time t.

complete( ): Notification of completion will be made if the process proceeds to time t indicated by advance.

FIG. 4 illustrates an example of the emulation operation of a processor using these commands. In FIG. 4, first the processor receives the command advance($t_g$). The processor outputs load($t_1$, $a_1$) at time $t_1$. In response, the processor receives resume($v_1$). The processor outputs store($t_2$, $a_2$, $v_2$) at time $t_2$.

When time $t_g$ is reached, the processor outputs complete( )in accordance with advance($t_g$) that was previously received. Next, the processor can receive interrupt(i) based on the reaction of the plant. In this case, the next advance( )instruction will be received Next, the operation of peripheral emulation is described while referring to FIG. 5. As described above, the peripheral emulator is preferably constructed using SystemC. Peripheral emulation performs execution of a transaction in accordance with an event loaded in the task queue.

The event can be a read request or a write request of the register or the like. The peripheral emulation retrieves this event in order from the top of the task queue, interprets the event, executes as a transaction, converts to a new event, and then re-inserts to the task queue. Conversion to one or more events is possible, and it is also possible that no event is generated. Event interpretation and execution depends on the function of each peripheral. Peripheral emulation is performed by repeating the process until the event is finished. In other words, pop (remove), execute (execute) and push (insert) are repeated.

With this embodiment, the simulation is not close to peripherals, but rather is a simulation that links the processor and the plant, so events are switched across the task queues of a plurality of peripheral emulators. In this case, the peripheral scheduler adds an event to the appropriate task queue. In other words, pop, execute, push or export (insert or transfer), import (import) are repeated. However, import is optional (none) depending on the cycle.

Input and output of the plant simulator is the event <port_update, t,p, v>. Here, port p provides notification of value y at time t. For example, instructions to the plant (signaling) and notifications of state change from the plant are expressed in this manner.

Requests issued from the processor include <read, t, r> events and <write, t, r,v> events, and these are an event that requests reading of a value in register r at time t and an event that requests writing value v to register r at time t. Conversely, the processor receives the event <register_update, t,r,v>, and this acts in agreement with the request <read,t,r> and provides notification of value v in register r at time t. Furthermore, <interrupt, t,i> is also a reception event, and this is an event that provides notification that an interrupt I was generated at time t.

In this embodiment in particular, the operations related to the peripheral task you are recorded below in order to support the description.

insert(e[t]): Adds event e[t] that was generated at time t to the task queue.

next( ):k: Retrieves the top of the task queue (pop), ignite (execute), and returns a new event if necessary as a response.

Peek( ): t: Returns the time t of the event at the top of the task queue.

The new events returned by next include internal events closed to peripherals such as timer ignition and the like, but in particular, events that are to be transferred to other peripherals are the 3 events <interrupt, t, i>, <register_update, t, r, v>, and <port_update, t, p, v>.

Naturally, the operation of peripherals is not limited to these, but for the time being, peripherals related to the operation of the present invention were described.

Figure 5:
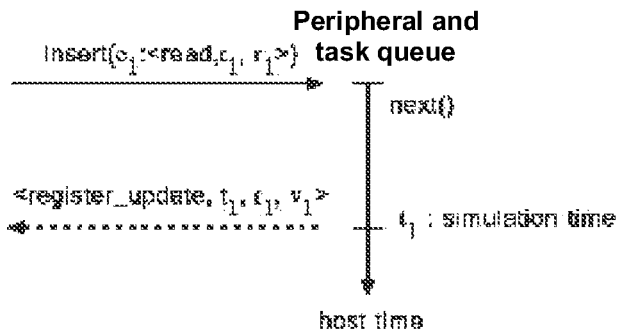
FIG. 5 illustrates an example of peripheral emulation operation.
Figure 5:
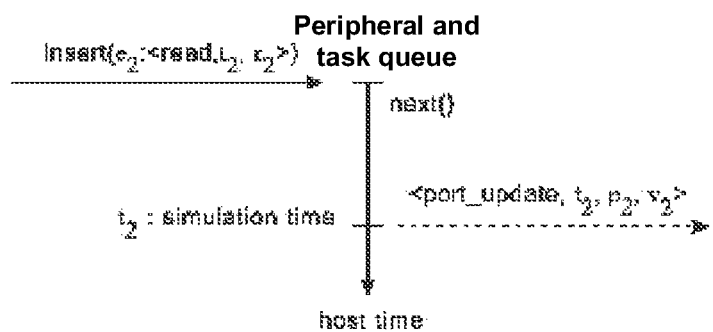
Figure 5:
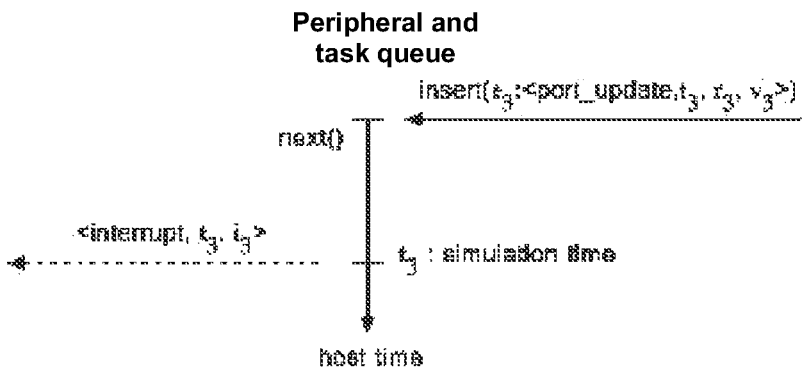

FIG. 5 illustrates an example of a peripheral emulation operation. In FIG. 5 (1), first, a task queue operation command insert($e_1[t_1]$) arrives to the peripheral from the scheduler, so event $e_1$ is added by FIFO. If the task queue is empty, or if another event time is later than $t_1$, then $e_1$ is returned to the top of the task queue. Herein, $e_1$ is a register read request.

When the operating command next ( ) arrives, the event at the top of the task queue is interpreted, executed as a transaction, and a new event <register_update, t1,r1,v1> is output. This example is a series of process flows from the processor outputting a request to read the value of the register until a response is obtained. The event is to be sent externally so insertion (push) is not performed to the original task queue, and rather the event is transferred (exported) to the scheduler of the processor.

As illustrated in FIG. 5 (2), when the write request insert ($e_2[t_2]$) to the register and the next ( )commands arrive to the peripheral, similarly, if $e_2$ that is packed in the task queue is at the top, $e_2$ will be popped at time $t_2$, and for example, a new event <port_update, $t_2$, $p_2$, $v_2$> will be returned to the scheduler. This example is the case where the processor sends signaling instructions to the plant. The new event is converted to a form that can be interpreted by the plant simulator before transferring.

The example of FIG. 5(3) demonstrates the situation where a notification of a state change is provided from the plant, and transferred to the processor using an interrupt signal. When the scheduler retrieves (pop) and executes (executes) after a notification of state change is added to the task queue (insert (e3[t3]), conversion to a new event is performed <interrupt, t, i> and transferred (export) to the processor.

Figure 6:
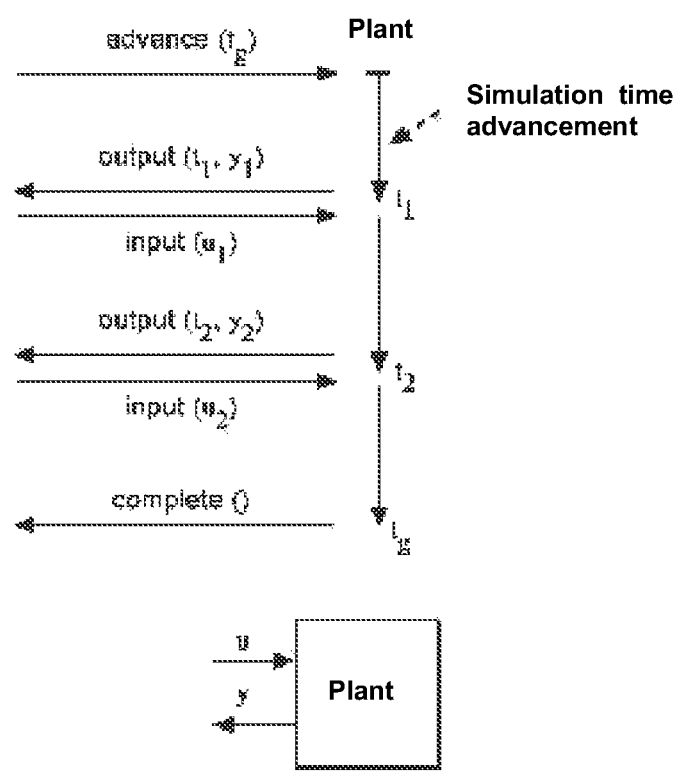
FIG. 6 illustrates an example of plant simulation operation.

The operation of plant simulation is described while referring to FIG. 6. As described above, plant simulation is preferably achieved by a continuous value simulation modeling system such as MATLAB®/Simulink®. The plant first calculates the output (vector) in accordance with the internal state (vector) at a designated time and an external input (vector). Next, the changed portion (vector) of the internal state is output, but at this time, the changed portion of the internal state is adjusted based on the designated error range, maximum step with unique to the plant, and the zero crossing and the like, and then the next step time is determined.

In this embodiment in particular, the operation of the plant is recorded below in order to support the description.
Instructions To Plant
  Advance(t): Instructs the plant to execute until time t at the longest. However, if the steps until time t cannot be extended, execution will stop before that time.
  Input(u): Notification from plant that updates input vector u to the plant.
  complete( ) Notification that execution was completed by the time designated in advance.
  output(t,y): Notification that the output vector y output from the plant was updated at time t.

Naturally, the operations of the plants are not limited to these, but for the time being, the plants related to the operation of the present invention were described.

Note, for reference, the response to the S-Function callback routine of Simulink® is presented.

| mdlGetTimeOfNextVarHit( ) call up | complete( ) |
| mdlGetTimeOfNextVarHit( ) return | advance(t) |
| mdlOutputs( ) call up | output(t,y) |
| mdlOutputs( ) return | input(u) |

FIG. 6 illustrates an example of plant simulation operation. In FIG. 6, first the command advance ($t_g$) arrives at the plant. The plant outputs output($t_1$,$y_1$) at simulation time $t_1$.

Next, input($u_1$) arrives at the plant. The plant outputs output($t_2$,$y_2$) at simulation time $t_2$.

Next, input($u_g$) arrives at the plant. When arriving at simulation time $t_g$, the plant outputs complete ( ).

This manner, advanced and complete, as well as output and input are paired together.

With the present invention, the internal peripherals scheduler, mutual peripherals scheduler, and external peripherals scheduler perform the major roles. First a summary of conservative event synchronous simulation and the terminology thereof is described below in preparation for describing the operation of the three schedulers.

Figure 7:
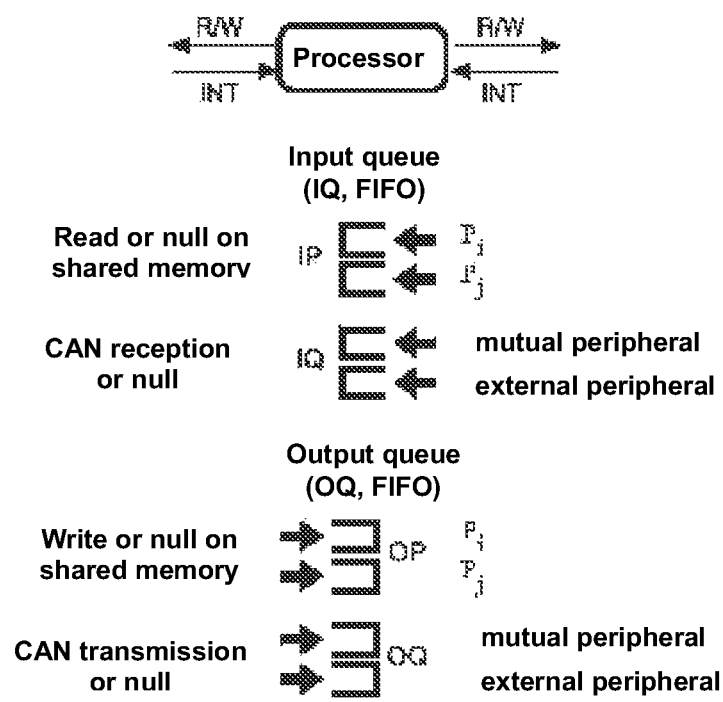
FIG. 7 is a diagram illustrating the component elements of an internal peripheral scheduler.

First, FIG. 7 is a diagram illustrating the processes related to the input queue and the output queue of the internal peripherals scheduler. As illustrated in the diagram, the input queue includes IP(Input Queue from Processors), or in other words a queue that receives event (updated notifications of shared memory) from other processors, and IQ, or in other words a queue that receives messages from the mutual peripheral or external peripheral. Pi and Pj represent the ith and jth processors, respectively. The data stored in IQ is the CAN reception, event message of an interrupt, or a null message.

On the other hand, the output queue includes OP(Output Queue to Processors), or in other words a queue that transmits events (updated notifications of shared memory) to other processors, and OQ, or in other words a queue that transmits messages to the mutual peripheral or external peripheral. The data stored in OQ is a CAN transmission event message, or a progress null message When processors exchange events together, IP and OP are used as a set for each connected processor.

Figure 8:
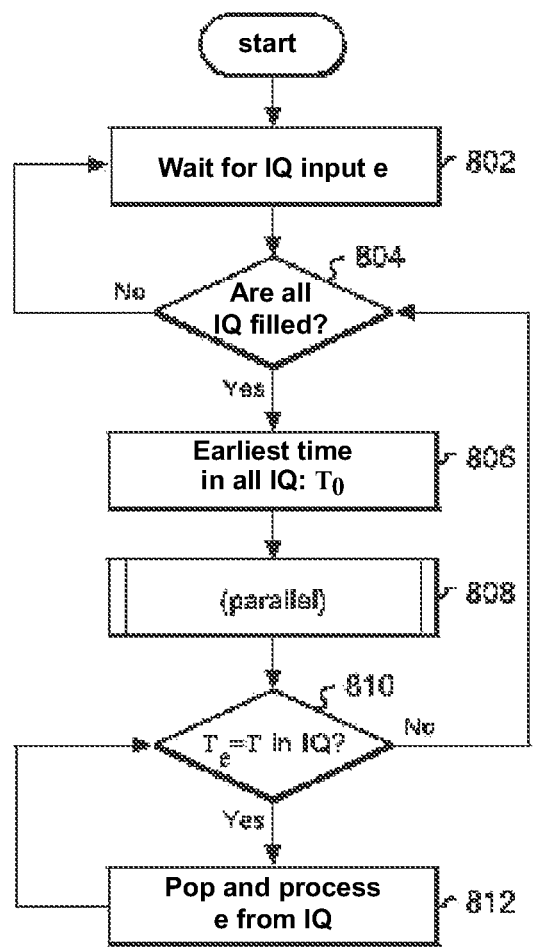
FIG. 8 is a diagram illustrating a process flow chart of an internal peripheral scheduler.
Figure 9:
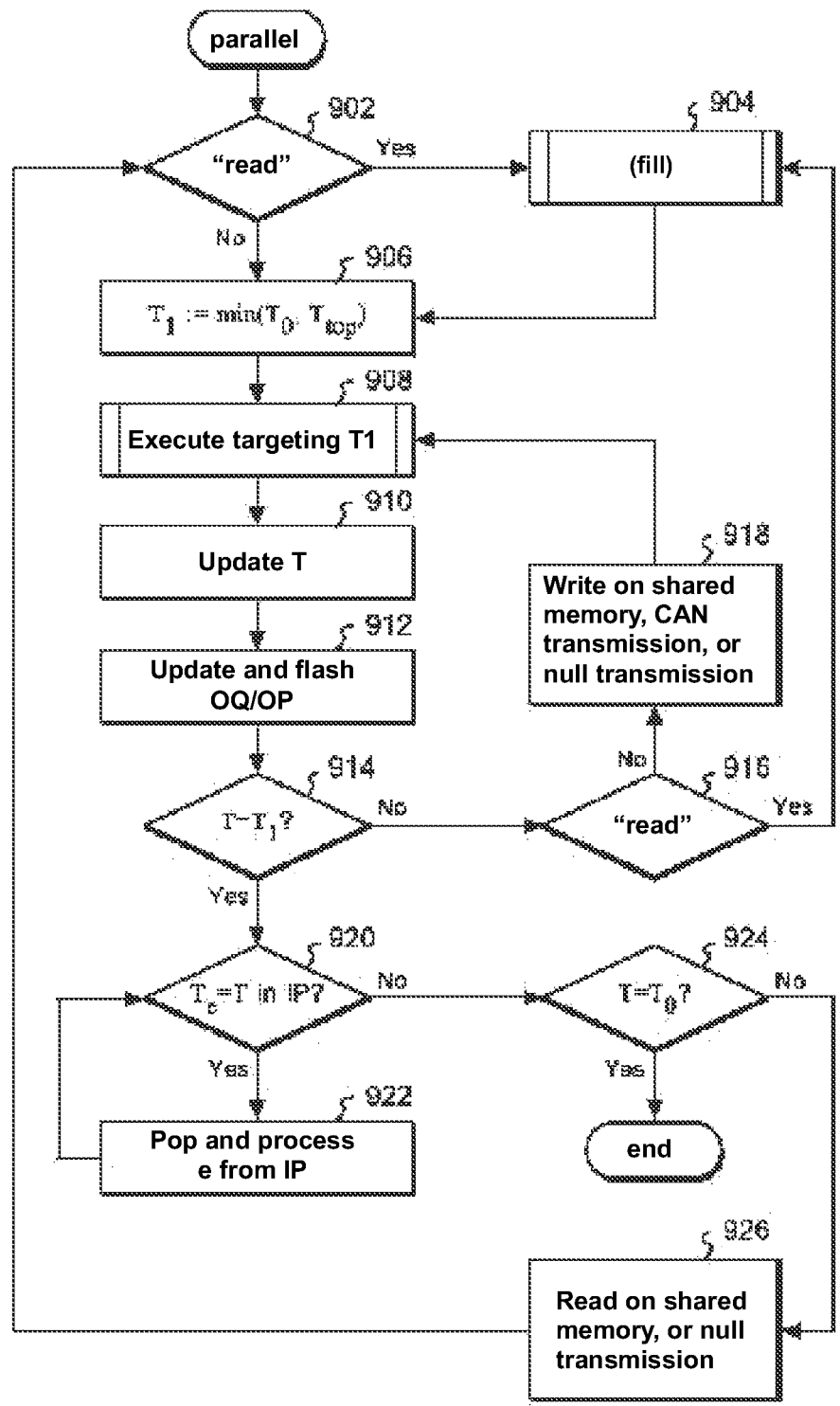
FIG. 9 is a diagram illustrating a process flow chart of an internal peripheral scheduler.
Figure 10:
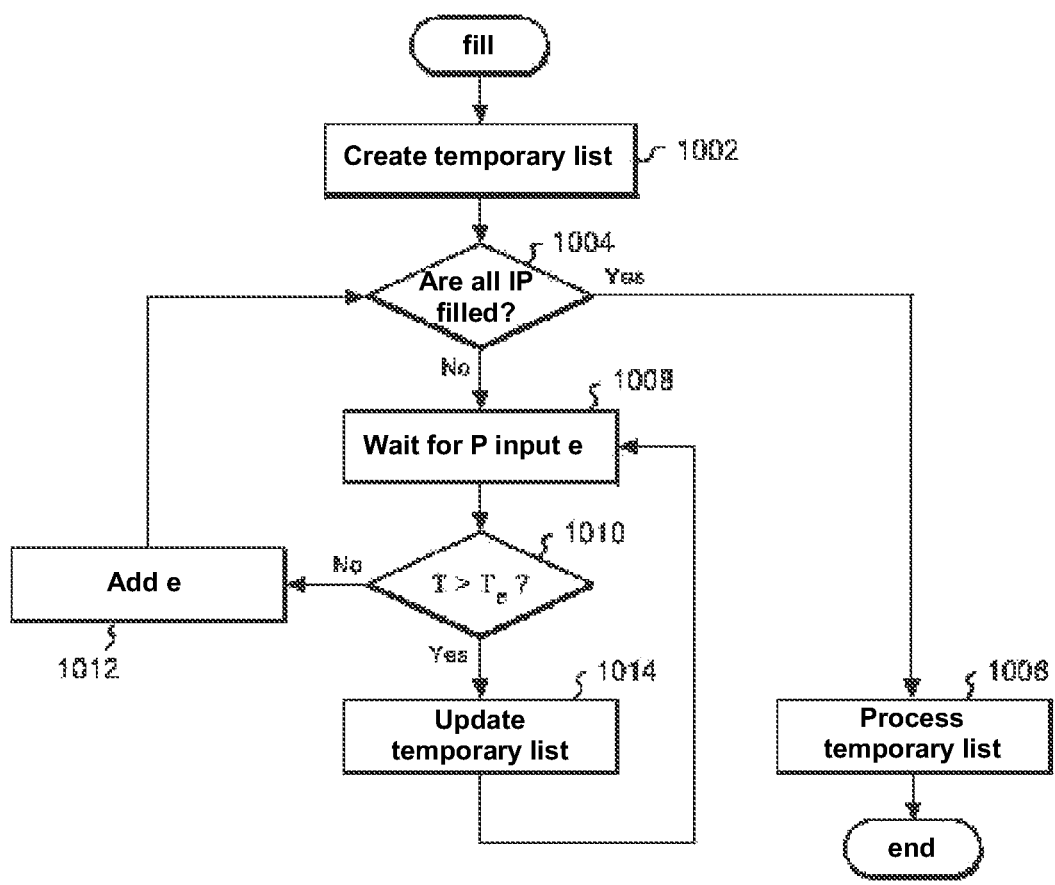
FIG. 10 is a diagram illustrating a process flow chart of an internal peripheral scheduler.

Next, the internal peripheral scheduler process is described while referring to the flowcharts of FIG. 8 through FIG. 10. The initial value of the flowchart of FIG. 8 is empty for all IQ/IP, the time zero progress event for all OQ, and empty for all OP, and T:=0.

Furthermore, time $T_k$ of the kth event that arrives at IQ/IP satisfies the following conditions.

$$T_k T_{k+i}$$

The internal peripherals scheduler waits for a queue input e in step 802, determines whether or not all IQ is filled (one or more message has arrived) in step 804, and if filled, sets the earliest time in all of IQ to $T_0$ in step 806, and calls up the subroutine "parallel" in step 808, and performs processes that proceed in parallel with other processors. Processing of the subroutine of "parallel" is described later while referring to the flowchart of FIG. 9.

In step 810, the internal peripherals scheduler determines if $T_0$=T in Q, or in other words if there is an event e that satisfies the condition $T_0$=T in IQ. Furthermore, if the condition is satisfied, the internal peripherals scheduler pops and processes the e from IQ in step 812, and then the flow returns to step 810.

In step 810, if there is no event e in IQ that satisfies $T_e$=T, the process returns to the decision of step 804.

Next, the "parallel" processing of step 808 is described in detail while referring to the flow chart of FIG. 9. In step 902, the internal peripherals scheduler determines whether or not the process is "read", and if so, the subroutine "fill" is called up in step 904.

The subroutine "fill" is described later while referring to the flowchart of FIG. 10. After step 904, the flow proceeds to step 906. If the process was not "read" in step 902, the flow proceeds strictly to step 906.

Step 906 inserts a value in $T_1$, based on the formula T1:=min($T_0$, $T_{top}$). If $T_{top}$ is the top time in IP, if there is no IP (no processes that perform shared memory communication), or if IP is empty, $T_{top}$=∞.

In step 908, the internal peripherals scheduler executes the processor, targeting $T_1$. In other words, the time proceeds to the time indicated by the mutual peripheral scheduler or the external peripheral scheduler.

In step 910, the internal peripheral scheduler executes the processor, while the time T proceeds by that amount, and in step 912, an update and flash of OQ/OP is performed.

In step 914, the internal peripheral scheduler determines if T=$T_1$, and if not, in step 916, a decision is made as to whether or not the latest notification from ISS is "read", and if so, the flow returns to step 904.

In step 916, if it is determined that the latest notification from ISS is not "read", in step 918, either writing to shared memory, CAN communication, or null message transmission is performed, and the flow returns to step 908.

In step 914, if T=$T_1$, the flow proceeds to step 920, and a decision is made as to whether or not $T_e$=T in IP, or in other words, if an event that satisfies the condition $T_e$=T is in the IP.

In step 920, if it is determined that an event that has the time of event e is not in the IP, a determination is made as to whether or not T=$T_0$, and if so, the process is terminated.

In step 924, if it is determined that T=$T_0$ is false, in step 926, either reading on shared memory or reception of a null message will be performed, the flow will return to the determination of step 902.

The "fill" processing of step 904 is described in detail while referring to the flow chart of FIG. 10. In FIG. 10, the internal peripheral scheduler creates a temporary list of entries in the IP queue. After creating the temporary list, all messages in the IP with a timestamp older than the current time are removed, and added to the temporary list.

In step 1004, the internal peripherals scheduler determines whether or not all IP are filled. If so, in step 1006, the events in the temporary list (written to shared memory from other processors) are all shown in timestamp order. When the temporary list is processed, the fill subroutine is terminated.

In step 1004, if it is determined that all of the IP is not filled, the flow proceeds to step 1008, and there the internal peripheral scheduler waits for an event e from the IP.

In step 1010, a determination is made as to whether T>Te, and if so, in step 1014, e is added and updated to the temporary list, and the flow returns to step 1008.

If it is determined in step 1010 that T>T0 is false, the internal peripherals scheduler adds e to the IP in step 1012, and the flow returns to step 1004.

Figure 11:
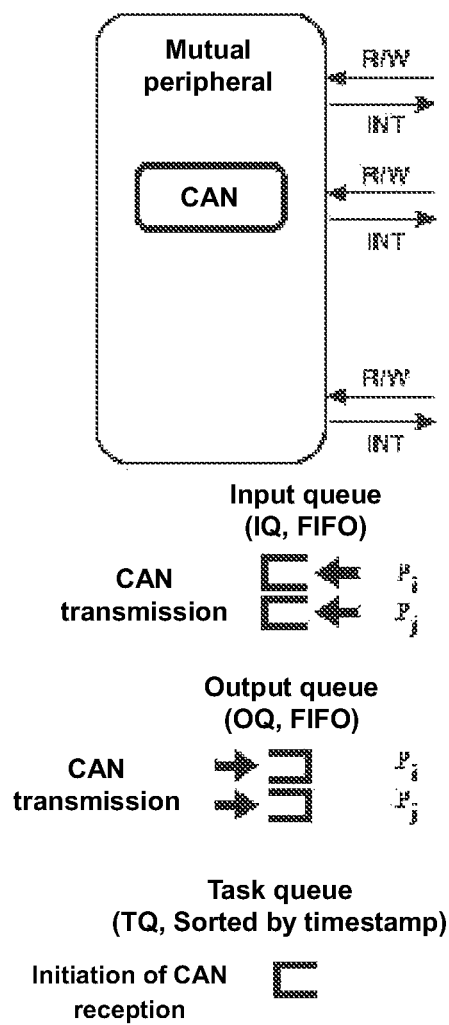
FIG. 11 is a diagram illustrating the component elements of an mutual peripheral scheduler.

FIG. 11 is a diagram illustrating the processes related to the queue of the mutual peripheral scheduler. As illustrated in the diagram, an event from Pi, Pj arrives at the input queue IQ, and is transmitted to the CAN emulator.

On the other hand, when an event arrives to the output queue OQ from the CAN emulator, the processor will retrieve the event.

Furthermore, a task queue TQ is established and this brings initiation of the CAN emulator. Note, it should be noted that in order to distinguish from the input queue and the output queue, events that are added to the task queue are referred to as tasks.

Figure 12:
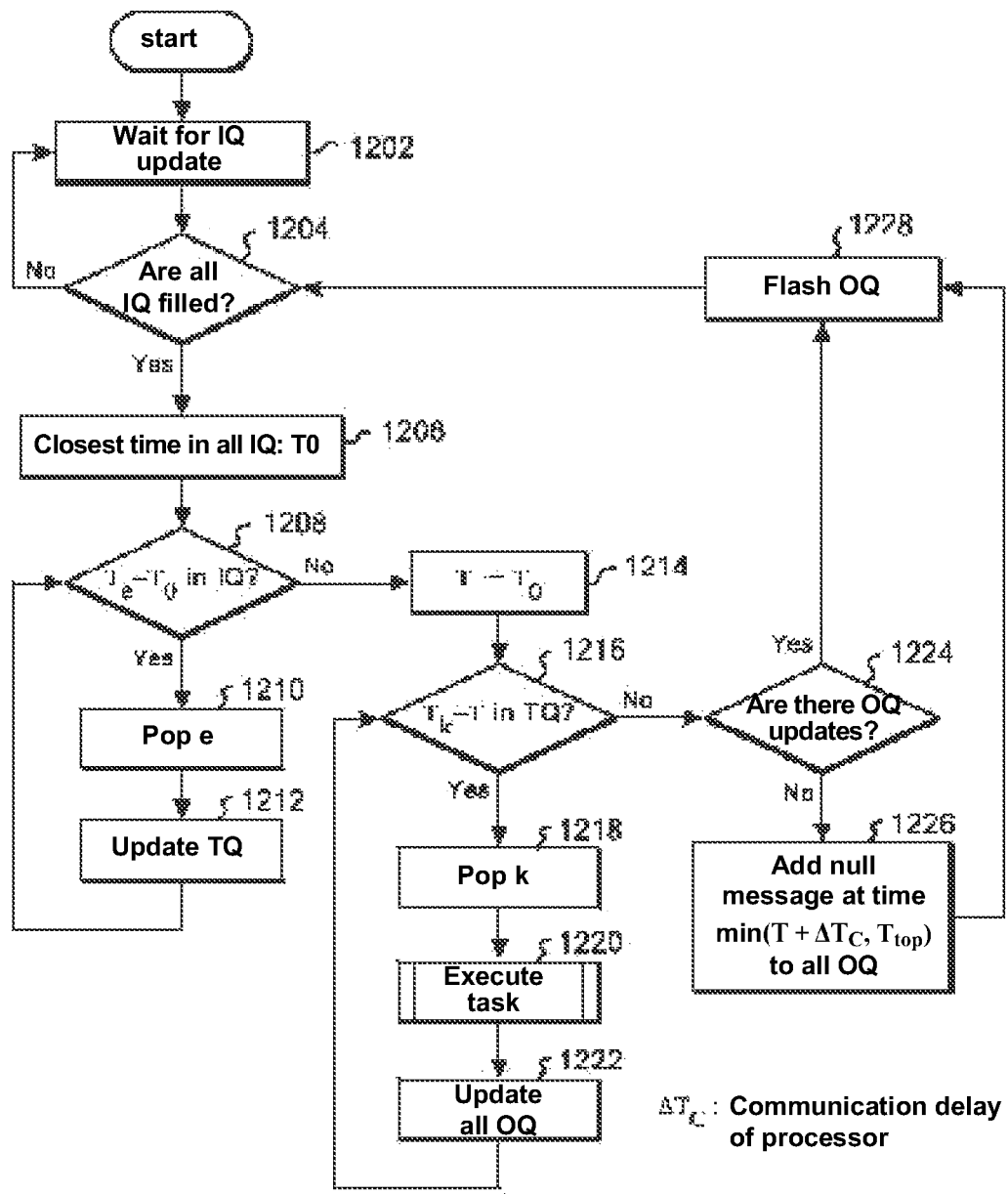
FIG. 12 is a diagram illustrating a process flow chart of an mutual peripheral scheduler.

The mutual peripheral scheduler process is described while referring to the flowcharts of FIG. 12. The initial values at this time are such that all IQ are empty, all OQ are empty, TQ is empty, and T:=0. In step 1202, the mutual peripheral scheduler waits for updating of the IQ, in step 1204, a determination is made as to whether or not all IQ are filled, and if not, the flow returns to step 1202, and waiting for the update of IQ continues.

Furthermore, in step 1204, if the mutual peripheral scheduler determines that all IQ are filled, in step 1206, the closest time in all IQ is considered to be $T_0$.

In step 1208, the mutual peripheral scheduler determines if $Te=T_0$ in IQ, or in other words if there is a task e in IQ where $Te=T_0$. If so, the mutual peripheral scheduler pops event e in step 1210, and updates TQ using insert($e_1[t]$), insert($e_2[t]$) in step 1212. Herein, event $e_1$ is <read, t, r>, or in other words is an event that reads the register r at time t, and event $e_2$ is <write, t, r, v>, or in other words an event that updates the value in register r to v at time t.

After step 1212, the flow returns to step 1208, and if the mutual peripheral scheduler determines that there is no task e in IQ where $T_e=T_0$, the condition $T:=T_0$ is set in step 1214, and in step 1216, peak( ) is used to determine whether or not $T_k=T$ in TQ, or in other words, if there is a task k in TQ where $T_k=T$.

In step 1216, a determination is made as to whether there is a task k in TQ where Tk=T, and the mutual peripheral scheduler pops k in step 1218, and executes the task using next( )in step 1220. Herein, events <interrupt, t, i>, <register_update, t, r, v>that are provided as notification to the processor are generated when CAN data is received.

In step 1222, the mutual peripheral scheduler updates all of the OQ, and the flow returns to step 1216.

In step 1216, if a determination is made that there is no task k in TQ where $T_k=T$, the flow proceeds to step 1224, and here the mutual peripheral scheduler determines whether or not oh queue has been updated.

If OQ has not been updated, the mutual peripheral scheduler adds a null message for time min($T+\Delta T_c$, $T_{top}$) to all OQ in step 1226, flashes OQ in step 1228, and then the flow returns to step 1204. Note, herein, $\Delta T_c$ is the communication delay time of the processor.

If OQ has been updated, the mutual peripheral scheduler flashes OQ in step 1228, and then the flow returns to step 1204.

Figure 13:
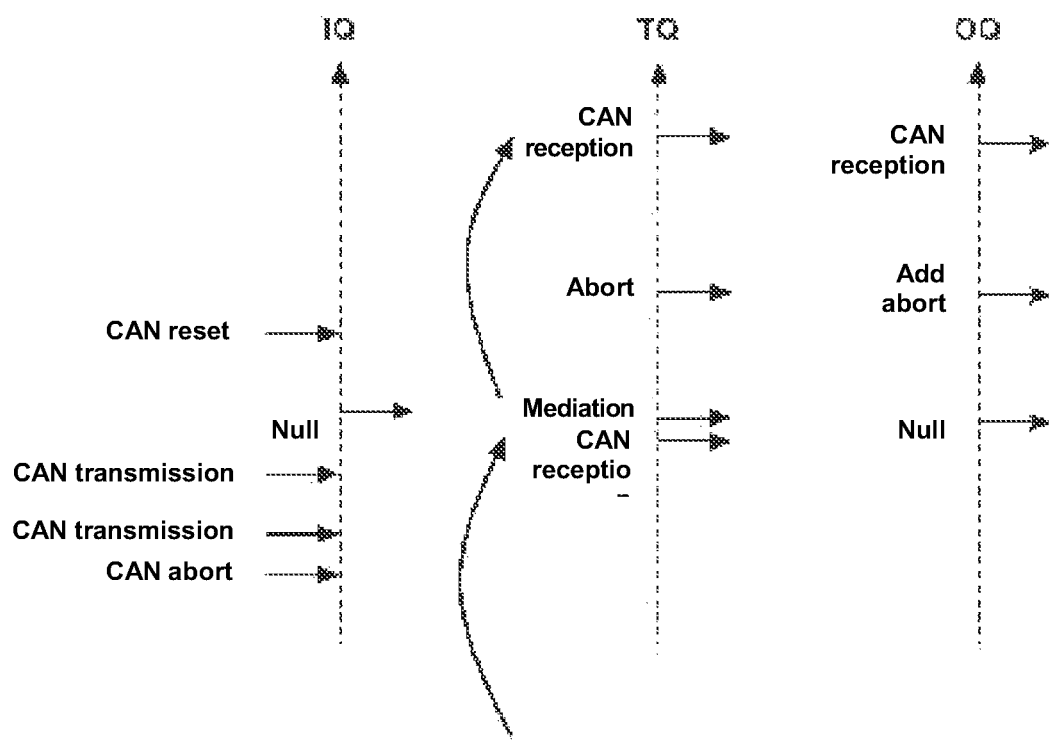
FIG. 13 is a diagram illustrating a process flow chart of an external peripheral scheduler.

For reference, FIG. 13 is a diagram illustrating an example of entering and leaving at the time of an event for TQ and the corresponding IQ and OQ for the mutual peripheral scheduler. The dotted line arrow shows the progress of the guest time.

In this example, the events of a message arriving at IQ from the processor scheduler (internal peripheral scheduler) are CAN abort, CAN transmission, null (progress message event), and CAN reset, in chronological order. The above messages other than null are all events that are generated by the processor sending a command (to perform register right) to the CAN device. Of these, CAN abort is an event that sends a command to cancel the transmission standby condition if arbitration fails, and send an interrupt notification to the processor. CAN transmission is an event that sends a command to send data that has been set beforehand. FIG. 13 illustrates an example where CAN transmission events from two different processors arrive consecutively. CAN reset is an event that sends a command that separates the CAN device from the bus and restores the initial conditions.

In this example, the events of the message that was sent to the processor scheduler are null (null message event), abort notification, and CAN reception, in chronological order. CAN reception is an event where the CAN device notifies the processor by interruption that CAN data has been received. Abort notification is an event where the CAN device notifies the processor by interruption that arbitration has failed.

When a CAN transmission event occurs (arrives at IQ), previous transmission initiated data can currently be in transmission. In the example of FIG. 13, when the second CAN transmission event arrives, the (first) CAN reception event is added to the top of the TQ in conjunction with completion of the transfer that had previously started. Immediately after the CAN reception event, arbitration is performed in order to transmit subsequent data. In the example of this diagram, the CAN reception event and the arbitration event timing are the same for simplification. The timestamp when a null event arrives at IQ is the same as the guest time for CAN reception and arbitration. Herein, the mutual peripheral scheduler of the present invention includes a process that notifies (send a null message) to the processor scheduler that performs advanced execution until the top time in TQ. The null that arrives at IQ in FIG. 13 is a progress message where the processor scheduler provides notification that the processor arrived before the timing of notification by this process. Furthermore, the null message that is initially transmitted by OQ in the diagram indicates notification of advanced execution to the processor scheduler by this process.

When arbitration is performed, one of the CAN transmissions that were requested from the two processors is accepted, (with arbitration), and the other is put on hold (fails arbitration). In the diagram, the CAN reception event to the processor that made the first transmission request is an event that provides abort notification to the processor that performs the second transmission request, but both are shown to be added to the TQ. The two added events are processed in order in conjunction with the progress of emulation by the CAN device, the corresponding event (abort notification, CAN reception) is notified to the processor scheduler through OQ.

Figure 14:
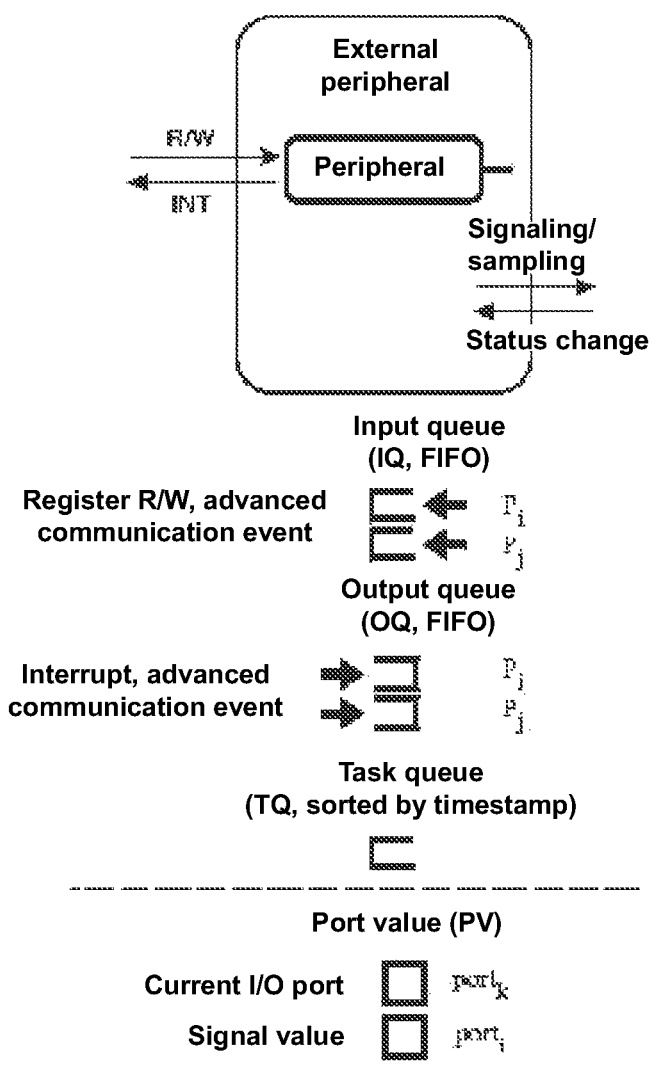
FIG. 14 is a diagram illustrating an example of entering and leaving at the time of an event for TQ and the corresponding IQ and OQ for the mutual peripheral scheduler.

FIG. 14 is a diagram illustrating the processes related to the queue of the external peripheral scheduler. As illustrated in the diagram, a message from $P_i$, $P_j$ arrives at the input queue IQ.

The event message and null message of the interrupt notification are transmitted to the output queue OQ, and these retrieve $P_i$, $P_j$.

The task queue TQ is sorted by time stamp. Furthermore, the external peripheral scheduler retains the current signal value of the I/O port that is connected to the plant.

Figure 15:
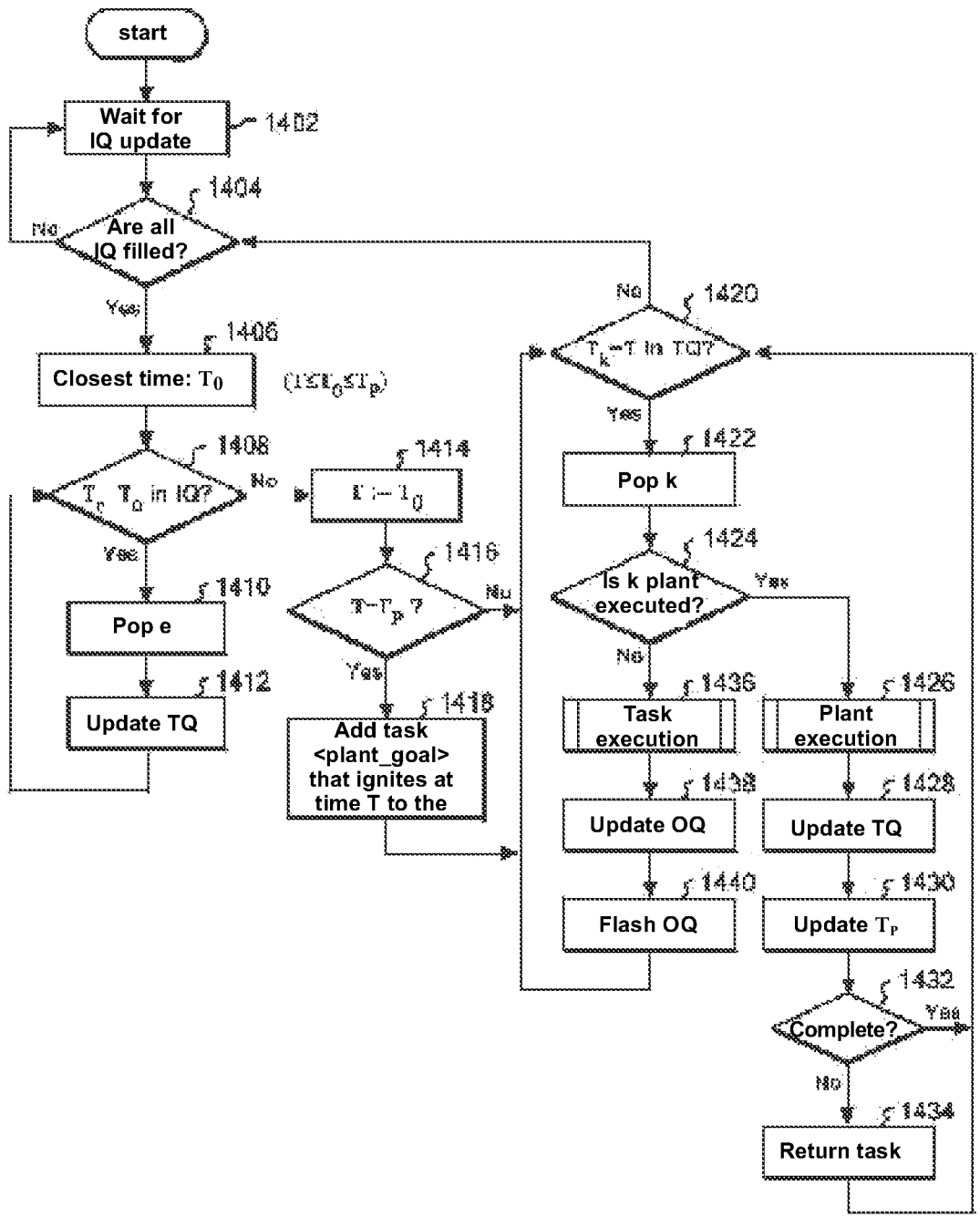
FIG. 15 is a diagram illustrating the component elements of an external peripheral scheduler.

Next, the external peripheral scheduler process is described while referring to the flowcharts of FIG. 15. The initial values at this time are such that all IQ are empty, all OQ are empty, TQ is empty, the PV (port value) is the initial value of the ECU specification, T: =0, and $T_R$: =$\Delta T_R$.

In step 1402, the external peripheral scheduler waits for updating of the IQ, in step 1404, a determination is made as to whether or not all IQ are filled, and if not, the flow returns to step 1402, and waiting for the update of IQ continues.

Furthermore, in step 1404, if the external peripheral scheduler determines that all IQ are filled, in step 1406, the closest time in all IQ is considered to be $T_0$. Herein, T Te Tp, and Tp is the current plant time.

In step 1408, the external peripheral scheduler determines if $T_e=T_0$ in IQ, or in other words if there is a task e in IQ where $T_e=T_0$. If so, the external peripheral scheduler pops event e in step 1410, and updates TQ using insert($e_1$[t]), insert($e_2$[t]) in step 1412. Herein, event $e_1$ is <read, t, r>, or in other words is an event that reads the register r at time t, and event $e_2$ is <write, t, r, v>, or in other words an event that updates the value in register r to v at time t.

After step 1412, the flow returns to step 1408, and if the external peripheral scheduler determines that there is no task e in IQ where Te=T0, the condition T:=T0 is set in step 1414, and in step 1416, a determination is made as to whether or not T=$T_p$.

If it is determined in step 1416 that T=Tp, the external peripheral scheduler will call up insert ($e_4$[T]) in step 1418, and will add task <plant_go> that ignites at time T to the TQ. Herein, $e_4$ is an event that executes the plant at time min{$T_{top}$, T+$\Delta T_R$}. Ttop is the top time of TQ, and if TQ is empty, Ttop=∞. In other words, if all of the processors track the plant, this will be the leading executed process of the plant.

After step 1418, the flow proceeds to the determination step of step 1420. If it is determined that T=Tp is false in step 1416, the flow proceeds directly to step 1420.

In step 1420, the external peripheral scheduler calls up peek ( ) and determines if there is an event k where $T_k=T$ in IQ. If not, the flow returns to step 1404.

In step 1420, a determination is made as to whether there is an event k in TQ where Tk=T, and the external peripheral scheduler pops k in step 1422, and in step 1424, determines whether or not k is plant executed.

If the external peripheral scheduler determines in step 1420 that k is plant executed, advance ( ) is called up in step 1426, and the plant is executed.

In the subsequent step 1428, the external peripheral scheduler performs an update of TQ. Specifically, output (t,y) is received, pusg(e3[t]) is executed, and notification of input (u) is made with reference to PV. Furthermore, a null message is transmitted. This event updates the port p value v using <port_update, p, v>.

In the next step 1430, the external peripheral scheduler updates Tp, and in the next step 1432, determines whether or not the process is complete. If it is determined that the process is complete, the flow returns to step 1420. If it is determined that the process is not complete, the flow returns to step 1420 after returning the task in step 1434, Returning to step 1424, if it is determined that k is not plant execution, the external peripheral scheduler proceeds to step 1436, calls up next ( ) and executes the task. Specifically, this refers to executing <interrupt>, <register value>, <register_update>, and <port_update>, and transmitting a null message.

In the subsequent step 1438, the external peripheral scheduler performs an update of OQ. Here, if a message other than null is added to the OQ, the task that ignites at time T+$\Delta T_R$ is added to the TQ. In other words, insert($e_4$[T+$\Delta T_R$]) will be executed, but specifically, the plant will be executed until time min{Ttop, T+$\Delta$TR}. Herein, $T_{top}$ is the top time of TQ, and if TQ is empty, Ttop=∞.

In the next step 1440, the external peripheral scheduler flashes all of the OQ, and the flow returns to step 1420.

The occurrence of deadlock when conservative event synchronization is performed and the need for a null message to avoid this deadlock is described below. Note, this is not a new discovery, and is a conventionally known finding.

Figure 16:
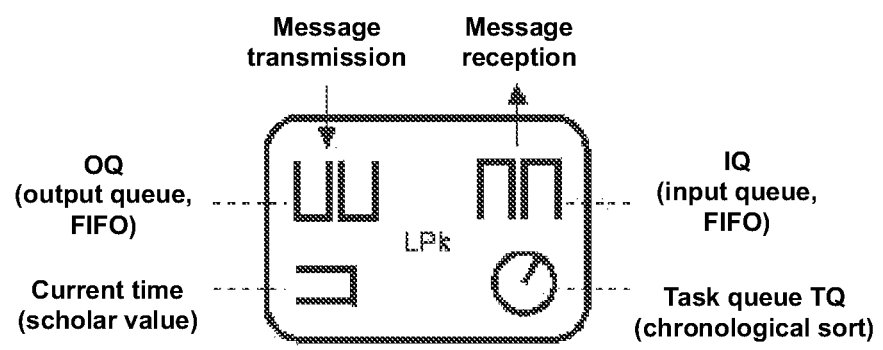
FIG. 16 is a diagram illustrating the configuration of a logical process.

If the simulation subject is split and the simulators (or emulators) of each region are connected to perform simulation of the entire subject, the simulation units of each region including the communication interface is referred to as a logical process. FIG. 16 illustrates the configuration of a logical process.

As illustrated in FIG. 16, during conservative event synchronization simulation, the logical process (LPk) includes an input queue IQ for message reception, output queue OQ for message transmission, a task queue TQ4 recording scheduled simulation tasks, and a scholar value indicating the current time. The IQ and OQ are FIFO, and the TQ is sorted chronologically.

Figure 17:
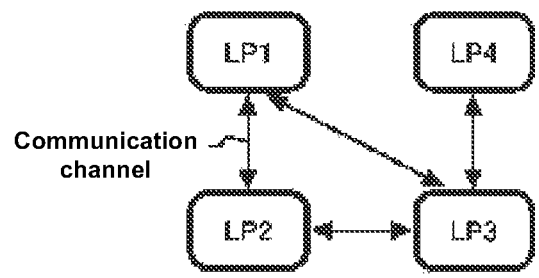
FIG. 17 is a diagram illustrating a logical process group that is connected.

FIG. 17 is a diagram illustrating the situation where a plurality of logical processes (LP1 through LP4) is connected through a communication channel. The various logical processes have an IQ and OQ for each communication channel in order to provide this communication.

The logical processes exchange messages with time information (timestamp). A timestamp for messages that are transmitted/received by the IQ/OQ steadily increased each time a transmission/reception is performed. Therefore, if the logical process receives a message from any other logical process, simulation can proceed without rollback to the smallest timestamp of the messages received. The exchanged messages include event messages and null messages.

The event message related to event e at time t is a message that that states "the time of the next events generated from the transmission side to the reception side is t, and the event that is generated is e".

Figure 18A:
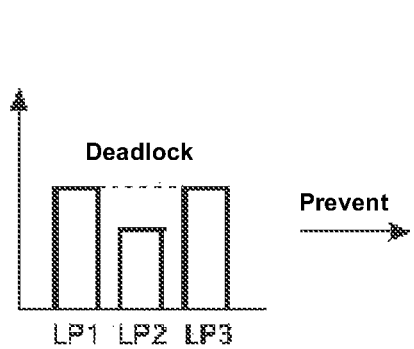
FIG. 18 is a diagram illustrating a situation where deadlock is prevented by a null message.
Figure 18B:
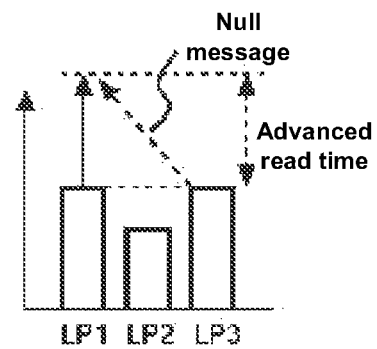

The null message of time t is a message that states "the time of the next event generated from the transmission side to the reception side will be after t", and does not have an effect on the actual simulation region on the reception side. The purpose of the null message is to prevent deadlock as described below. With conservative event synchronization, processes are stopped until reception of a message with a timestamp larger than the current timestamp from all other logical processes in order to prevent rollback. However, if the other logical processes waiting message reception are waiting for reception from that logical process at the identical time, both logical processors will wait for each other's messages and processing cannot restart, as illustrated in FIG. 18(a). Therefore, "advanced reading" is performed to determine how long back from the current timestamp an event to the outside has not been generated, and prevents deadlock by sending a null message as illustrated in FIG. 18(b).

A summary of the process of a logical process is shown below.
(1) Wait until a message arrives at the entire IQ
(2) Pop the earliest time message (t=T$_0$) in the IQ
(3) Perform simulation (pop the task queue and perform) while forwarding the current time to T$_0$
  (a) Future events are added to the task queue
  (b) Events generated for the outside are added sequentially to the OQ
  (c) A null message is added to those OQ where events are not added (t=current time+advance free time)
The message popped in (2) is processed and returned to (1).

According to the present invention, a null message where "advanced reading" is not performed ((a no message with the current time as of transmission as the timestamp) is referred to as a progress message. The purpose of the progress message is to avoid frequent synchronization caused by the null message which has a minute advanced read width. With the present invention, the internal peripheral scheduler transmits the progress message. This is because the ISS that drives the internal peripheral scheduler can only predict the next event of another logical process with a minute width.

The processor communication delay $\Delta T_c$ is described while referring to FIG. 19. In other words, as illustrated in the diagram, the smallest value of the delay from writing to the mutual peripheral until generation of an interrupt to the reception side/transmission side processor is the processor communication delay $\Delta T_c$.

Incidentally, when communicating by CAN with a maximum baud rate of 1.0 Mbps, the maximum delay of a data frame is 44 ps (the frame minimum bid count is 44), and this is the reference value for $\Delta T_c$.

Figure 20:
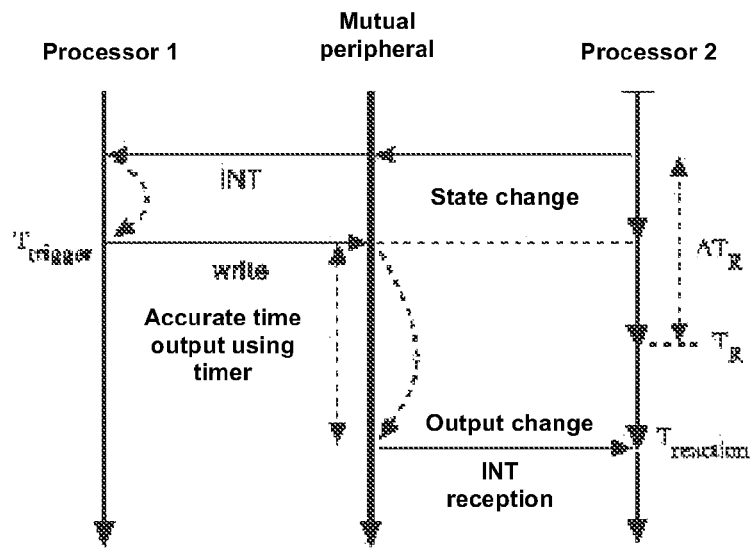
FIG. 20 is a diagram for describing the reaction delay $\Delta Tr$ of the processor.

The processor reaction delay $\Delta T_R$ is described while referring to FIG. 20. In other words, as illustrated in the diagram, the processor reaction delay $\Delta T$ is the minimum value for the delay from the plant input time until the corresponding processor reaction is transferred to the plant and has become effective. $T_R$ in FIG. 20 is the minimum time that has a possibility for the processor reaction to reach the plant when the TQ is empty.

As a prerequisite, a register interrupt that determines the initial event generation time $T_{reaction}$ to the plant is generated within $T_R$ from receiving an interrupt caused by a state change of the plant. If this interrupt time is expressed by $T_{trigger}$, the following formula is established.

$$T_{trigger} \ll T_R \leq T_{reaction}$$

Even if the plant is advance executed using the time from when the processor determines the operation (time $T_{trigger}$) until the actuator operates (time $T_{reaction}$) as the advanced read, time precision will not be lost, and the processor reaction delay $\Delta T_R$ is used based on using this finding.

An example of the processor reaction delay is illustrated. As a first example, with engine fuel injection control, if a rotation poles (state change) is generated from the plant every 15° of the crank, fuel injection and ignition instructions will be executed using a timer in order to make the timing accurate. Time setting for the timer is calculated when one or more of the aforementioned rotational pulses are generated, so there will be one or more pulse intervals until injection and ignition, or in other words there will be sufficient delay of with a pulse interval of 250 μs or more at a maximum rotational speed of 10,000 RPM. This is the reaction delay.

As another example, with control where the processor immediately returns instructions with regards to input from a plant, the reaction delay will be extremely small. However, with this type of control, often cyclical tasks are executed with regards to a physical phenomenon that is slow compared to the processor (examples: instructions of a PWM signal to a fan where the temperature is the controlled variable, instructions for throttle opening where vehicle speed is the controlled variable). Approximations of the control period for temperature, speed, and torque are 1 second, 1 ms, and 0.1 ms, respectively, and there is no need to provide instructions to the plant at smaller time units than these. Therefore, the time that is determined by the size of the time units of the plant are used as the reaction delay.

Figure 21:
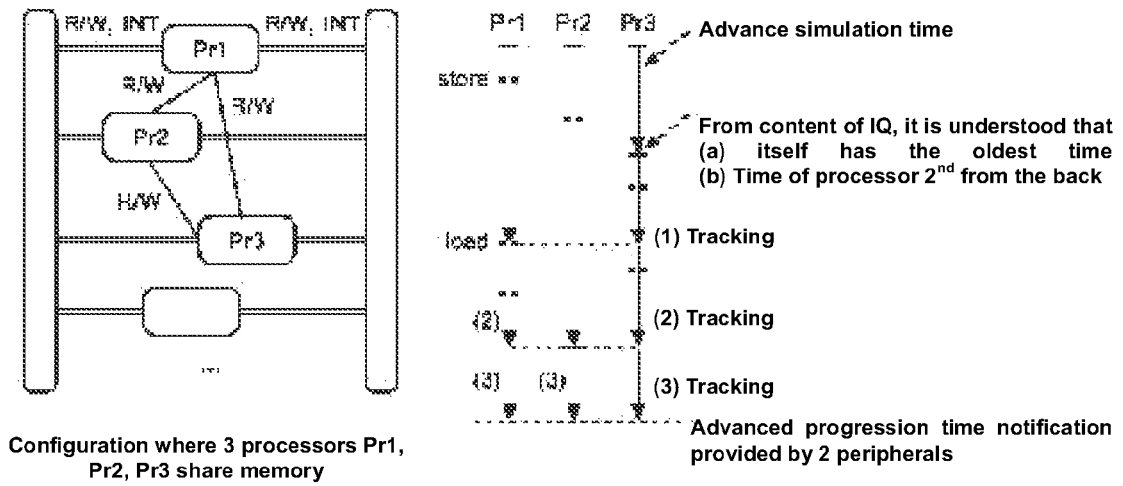
FIG. 21 is a diagram for describing the simulation of a shared memory access.

Simulation of shared memory access is described while referring to FIG. 21. In FIG. 21, the processors Pr1, Pr2, Pr3 access shared memory. Therefore, the processors Pr1 and Pr2 lead, and processor Pr3 follows processors Pr1 and Pr2. Therefore, processor Pr3 understands that is at the latest time, and knows the timing of the second processor from the back, based on the contents of the IQ. Therefore, store and load are performed while tracking the second processor. Eventually, a stop occurs immediately before load, and restart is achieved by performing load after all of the past store operations that have reached the IQ have been reflected in chronological order.

All of the processors must restart after reaching the "oldest time" so deadlock is avoided. Conversely, with a logical process where R/W is cyclically performed in this manner, deadlock will not occur. Therefore, simulation is possible without deadlock while maintaining the integrity of reading and writing.

Figure 22:
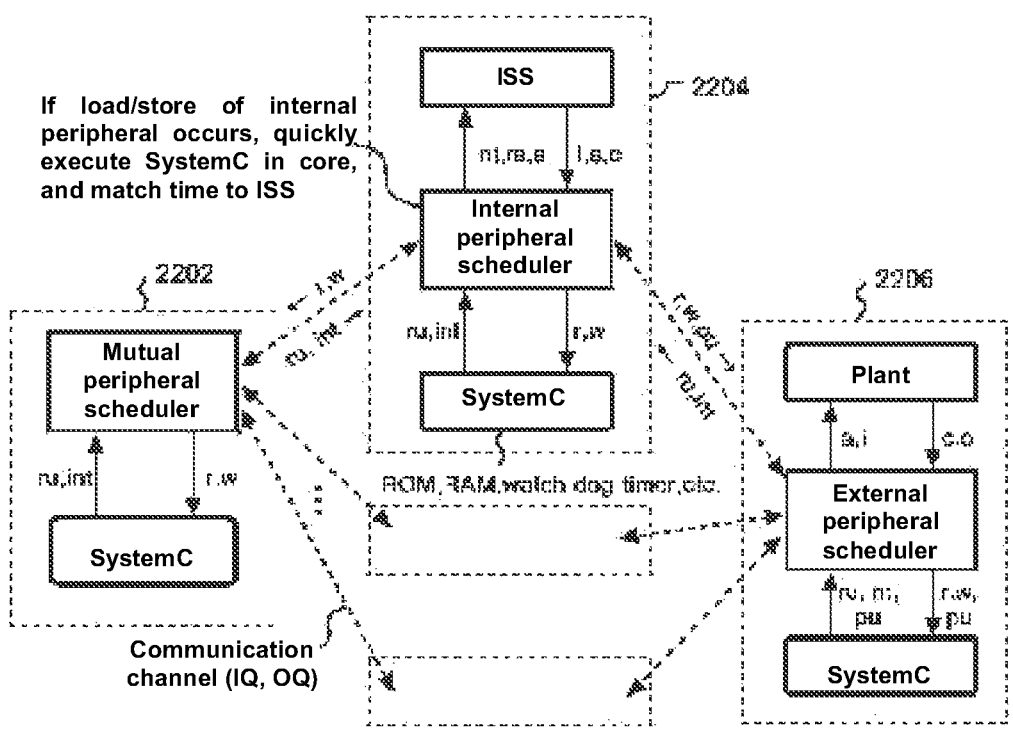
FIG. 22 is a diagram for describing emulation using the same core as ISS on a peripheral with a high frequency of communication with the processor.

FIG. 22 illustrates an example of allocating the functions of the ISS, peripheral emulator, plant simulator, and three schedulers of the present invention to the core of a host computer. Simulation can be performed at high frequency by emulating the internal peripheral scheduler and the ISS, which communicate frequently with the processor, using the same core 2204.

The internal peripheral scheduler divides load/store commands from the ISS to the internal peripheral (SystemC in the core), mutual peripheral, and external peripheral, by referring to the memory map specification of the ECU.

Figure 23:
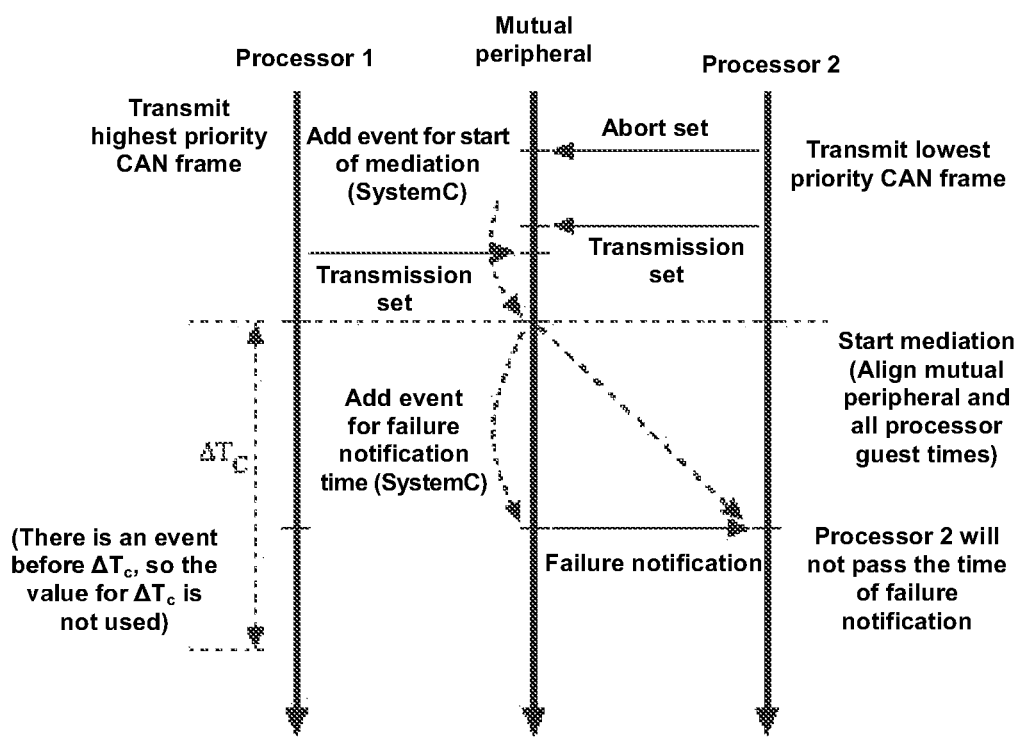
FIG. 23 is a diagram for describing the simulation of an operation that is stopped during a port to the CAN device.

Note, the expressions in the diagram are as shown below.
<ISS>
int: interrupt
rs: resume
a: advance
l: load
s: store
c: complete
<SystemC>
r: read
w: write
ru: register update
int: interrupt
pu: port update
<Plant>
a: advance
i: input
c: complete
o: output
<Communication Channel>
r: read
w: write
ru: register update
int: interrupt Next, the fact that the operation of providing an abort notification to a processor after CAN device modulation has failed can be conservatively emulated (without causing rollback) by a mutual peripheral scheduler is described using FIG. 23. FIG. 23 illustrates an example where 2 processors 1, 2 make a CAN frame transmission request to a CAN device. The frame that is requested to be transmitted by processor 1 has a higher priority than the frame that has been requested to be transmitted by processor 2. Processor 2 transmits a command to the CAN device such that if arbitration fails, the transmission standby state will be canceled and an interrupt notification will be made (abort set). Furthermore, the dotted line arrow in the vertical direction of the diagram shows the progress of the guest time.

In the example of FIG. 23, the CAN device emulator (designated as SystemC or the like) begins the arbitration process after the two processors perform an abort set and a transmission set toward the CAN device (mutual peripheral). The event of starting arbitration is added to the TQ by the emulator of the CAN device, and all of the processors are synchronized to the guest time based on this time (arbitration start). In this example, the abort set, 2 transmission sets, and arbitration correspond to a CAN abort that reaches IQ, 2 CAN transmissions that reach the IQ, and an arbitration event that is added to TQ. Furthermore, in FIG. 23, the process of the mutual peripheral scheduler that is synchronized to the processor time is the reception of a progress message and transmission of a null message at the top time of TQ, and is the same process described in regards to FIG. 15.

Furthermore, the example of FIG. 23 illustrates that the CAN device emulator adds the event of the failure notification time to the TQ when arbitration begins. When the mutual peripheral scheduler provides notification of advanced execution to the next processor, the timestamp of the null message that is transmitted will not be $\Delta T_c$, but rather the time of the failure notification will be added. Therefore, the processor 2 will not pass the failure notification time (overhead requiring rollback).

Figure 24:
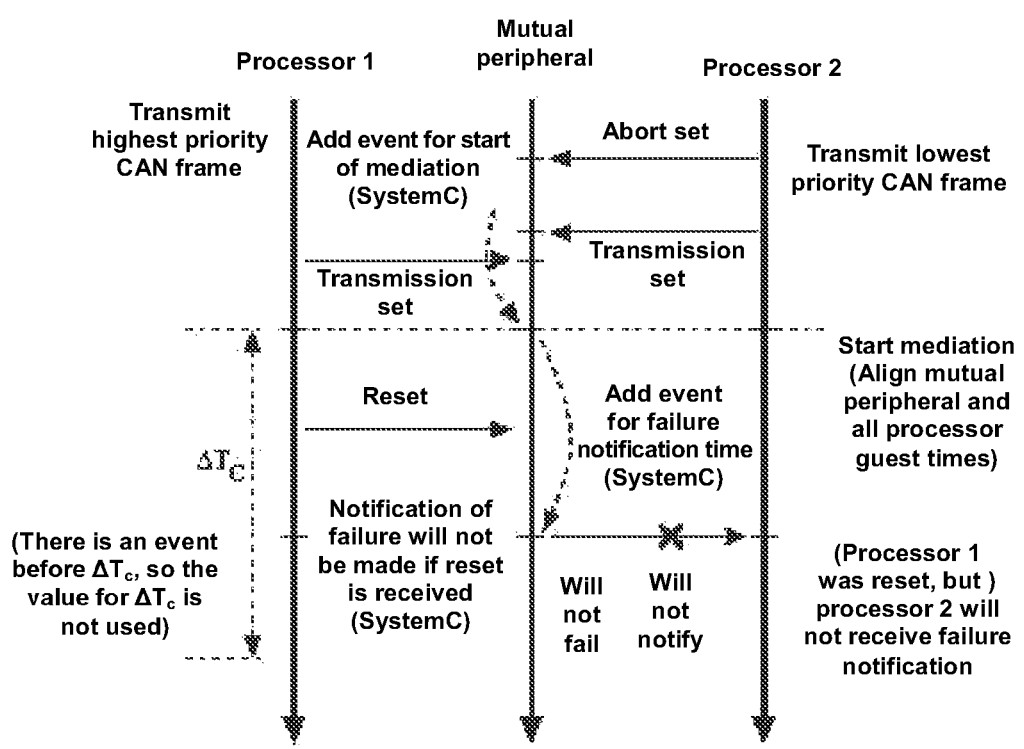
FIG. 24 is a diagram for describing the simulation for a CAN device reset.

The fact that the operation where a processor that has requested transmission of a high priority CAN frame resets the CAN device can be conservatively emulated (without causing rollback) by a mutual peripheral scheduler is described using FIG. 24.

This is made possible by checking for the occurrence of reset prior to failure notification in a CAN device emulator. The operation illustrated in FIG. 24 is the same as FIG. 23 up to the start of arbitration.

The example of FIG. 24 illustrates that processor 1 that transmits a request for a CAN frame with high priority will reset the CAN device between the start of arbitration and the completion of arbitration (confirmation of victory or failure of the frame) in guest time. As illustrated in the example of FIG. 23, an event for providing abort notification to the processor 2 is added to the TQ by the emulator of the CAN device at the moment arbitration is started.

In the example of FIG. 24, when processing the event for providing abort notification that was added, the emulator of the CAN device checks whether or not a notification of reset was made prior to providing the abort notification, and determines whether or not to provide abort notification.

By performing this determination, the emulator of the CAN device recalculates which CAN frame has won arbitration if a reset notification has been made. If a frame that had been scheduled to lose at the start of arbitration wins arbitration as a result of recalculation, an abort will not be generated, so the processor will not be notified of the abort. The example of FIG. 24 illustrates that the scheduled abort notification will not be made as a result of winning arbitration that results from recalculation of the CAN frame (that was scheduled to lose at the start of arbitration) that was requested for transmission by the second processor 2.

If a frame that had been scheduled to lose at the start of arbitration loses arbitration as a result of re-arbitration, an abort will be generated, so the processor will be notified of the abort as scheduled. Furthermore, if notification of reset was not made in the aforementioned determination process, there is no way to know when the CAN frame wins arbitration. Therefore, if reset notification is not made, the abort that was scheduled at the start of arbitration will be in notified to the processor.

Therefore, the processor will not inadvertently receive an abort notification (overhead requiring rollback) even though an abort was not generated by resetting because the emulator of the CAN device will check for the current of reset prior to notification of arbitration loss.

Figure 25:
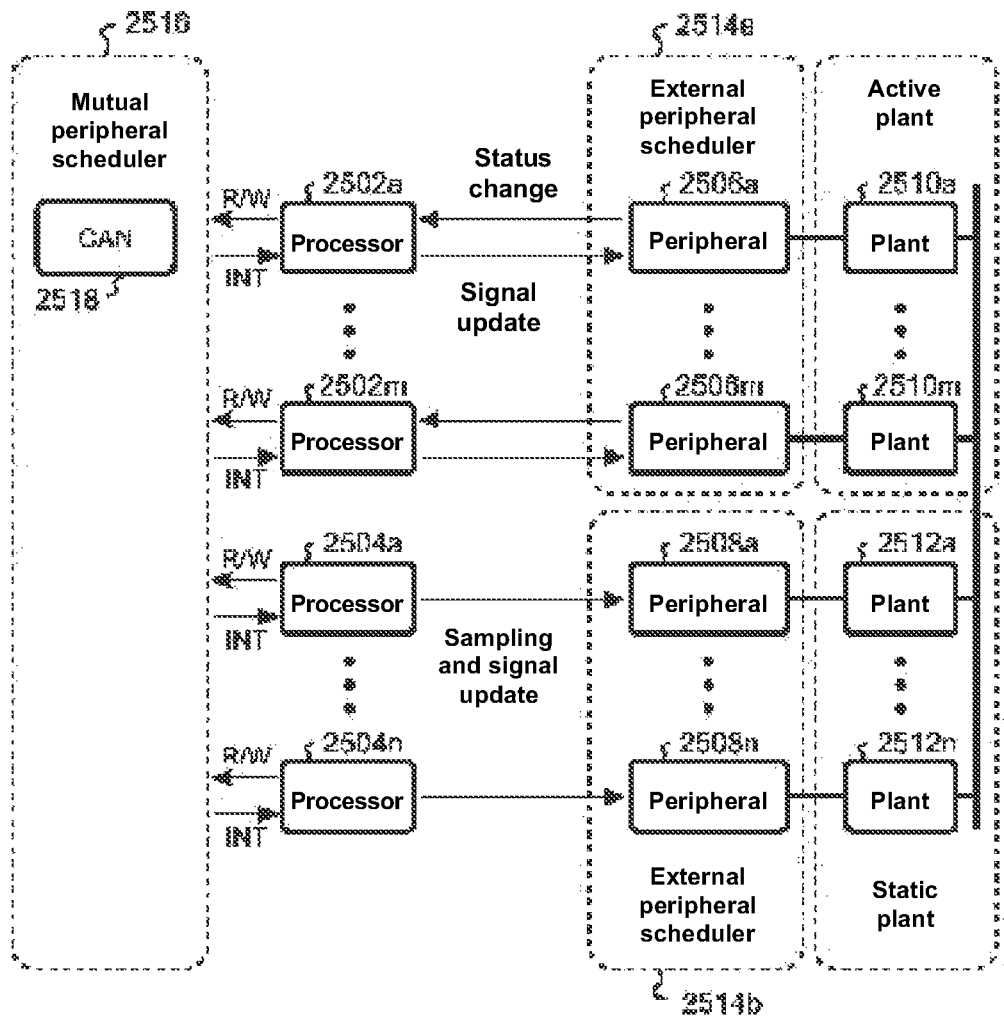

Next, another embodiment of the present invention is described below while referring to FIG. 25. In FIG. 25, processor emulators 2502a, . . . 2502m, 2504a, . . . 2504n have essentially the same function as the processor emulators 202a, . . . 202z illustrated in FIG. 2.

Peripheral emulators 2506a, . . . 2506m, 2508a, . . . 2508n also have essentially the same function as the peripheral emulators 204a, . . . 204z illustrated in FIG. 2.

The configuration of FIG. 25 differs from the configuration of FIG. 2 in that the plant simulator is divided into active plant simulators 2510a, . . . 2510m and passive plant simulators 2512a, . . . 2512n. Herein, the dynamic plant simulators are plant simulators with a function that autonomously determines the timing or the like of a status change such as an engine simulator. For example, an engine is a plant that provides information of the crank angle using pulses every 15°, but the timing cannot be determined by the controller (ECU) side.

On the other hand, a passive plant simulator is a plant simulator where the controller can determine the timing, and examples include plants that monitor (sample) the voltage of a battery at designated timing. Other examples of passive plants include sensor type plants such as temperature sensors, pressure sensors, rotational speed sensors and the like. Brakes and suspensions are also classified as passive plants if the state is detected by sampling.

Thus external peripheral schedulers, an external peripheral scheduler 2514a that schedule the peripheral emulators that are connected to the active plant simulators, and an external peripheral scheduler 2514b that schedule peripheral simulators that are connected to the passive plant emulators are provided in order to accommodate these active plant simulators and passive plant simulators. With regards to the peripheral emulators that are connected to the active plant simulators, the corresponding processor emulators provide notification of signal update on one hand, and also work to accept the status change, but for the peripheral emulators that are connected to a passive plant simulator, the corresponding processor emulator as a rule only provides notification of signal update and sampling advance notice.

Separating active plant simulators and passive plant simulators will basically not have an effect on communication between the processor emulators, so the operation of the mutual peripheral scheduler 2516 is essentially the same as the mutual peripheral scheduler 210 of FIG. 2, and the CAN emulator 2518 is also essentially the same as the CAN emulator 212 of FIG. 2.

Incidentally, the external peripheral scheduler 2514a for the active plant simulators is essentially the same in functionality as the external peripheral scheduler 208 of FIG. 2, but the external peripheral scheduler 2514b four passive plant simulators does not require a process of calculating the time width that advances the plant with regards to the processor.

Figure 26:
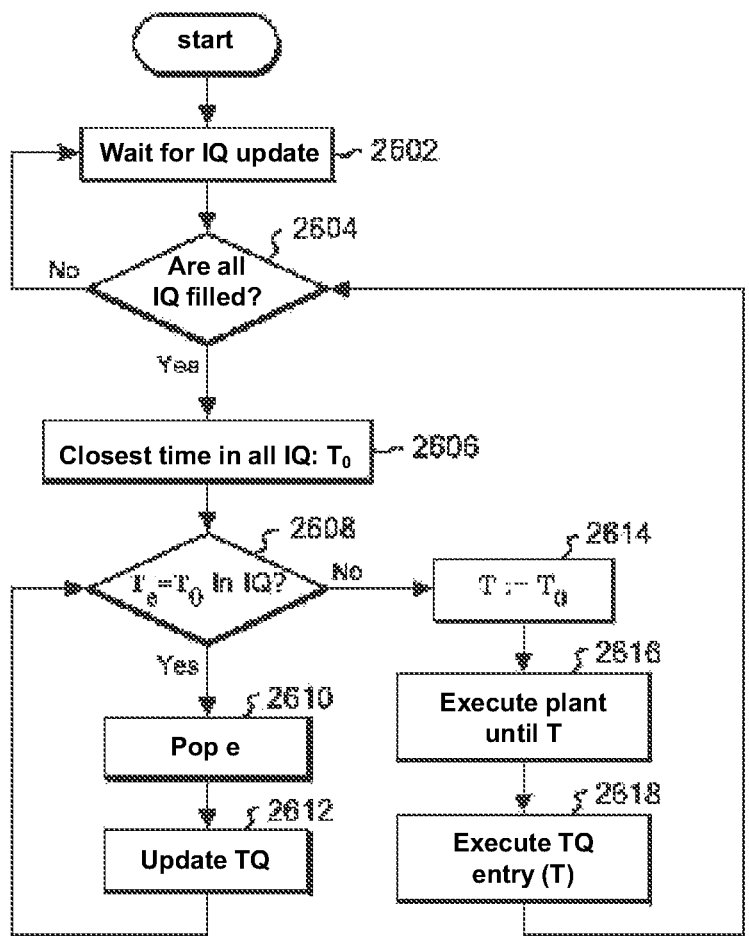
FIG. 26 is a diagram illustrating another embodiment of a function block for performing the present invention.

Therefore, the operation of the external peripheral scheduler 2514b is described while referring to the flowchart of FIG. 26. The initial values at this time are such that all IQ are empty, all OQ are empty, TQ is empty, the PV (port value) is the initial value of the ECU specification, T:=0. The external peripheral scheduler for passive plant simulators simply needs to repeat a process of catching up to the time for each notification of advanced processor time.

In step 2602, the external peripheral scheduler 2514b waits for updating of the IQ, in step 2604, a determination is made as to whether or not all IQ are filled, and if not, the flow returns to step 2602, and waiting for the update of IQ continues.

Furthermore, in step 2604, if the external peripheral scheduler 2514b determines that all IQ are filled, in step 1406, the closest time in all IQ is considered to be $T_0$.

In step 2608, the external peripheral scheduler 2514b determines if $T_e=T_0$ in IQ, or in other words, if there is a task e in IQ where $T_e=T_0$. If so, the external peripheral scheduler 2514b pops event e in step 2610, and updates TQ in step 2612.

After step 2612, the flow returns to step 2608, and if the external peripheral scheduler 2514b determines that there is no task e in IQ where $T_e=T_0$, the condition T:=T0 is set in step 2614.

Next, the flow proceeds to step 2616, where the external peripheral scheduler 2514b executes the plant until T. At this time, the plant is a passive plant, so the external peripheral scheduler 2514b does not receive notification of status change.

Next, the external peripheral scheduler 2514b executes TQ entry (T), and the flow returns to step 2604.

The case was described where CAN was the automotive LAN protocol handled by the mutual peripheral scheduler, but the simulation system of the present invention is not restricted to CAN, and can use any arbitrary automotive LAN protocol such as LIN or FlexRay or the like.

Specific embodiments of the present invention were described above in relation to a plurality of simulation systems for automobiles, but it should be understood to one skilled in the art of this field that the present invention is not restricted to these specific embodiments, and can be applied to simulations of general electromechanical controlled systems such as simulation systems for airplanes and the like.

Furthermore, the present invention is not restricted to specific computer architectures and platforms, and can be applied to any platform that can perform multitasking.

We claim:

1. A computer implemented simulation system that performs simulation, comprising:
   a plurality of processor emulators that run on a computer;
   a plurality of plant simulators that run on the computer;
   an external peripheral scheduler that runs on the computer, wherein the external peripheral scheduler (i) first runs a plant simulator until a reaction delay time of a processor emulator, and (ii) provides notification through a peripheral emulator to run the plant simulator before the processor emulator until a simulator stop time; and
   a mutual peripheral scheduler that runs on the computer and provides notification for running in advance of the processor emulator only for a communication delay time with the processor emulator, wherein the processor emulator performs conservative processing until a notification time.

2. The simulation system according to claim 1, wherein the computer is a multitask system, and the plurality of processor emulators, the plurality of plant simulators, the external peripheral scheduler, and the mutual peripheral scheduler are executed as individual threads or processes.

3. The simulation system according to claim 2, wherein the computer is a multicore or multiprocessor system, and the plurality of processor emulators, the plurality of plant simulators, the external peripheral scheduler, and the mutual peripheral scheduler are executed as individual threads or processes assigned to individual processors or cores that differ from the multiprocessor system.

4. The simulation system according to claim 3, wherein the plant simulator and the peripheral emulator that communicates with the plant simulator are assigned to a same core or processor.

5. The simulation system according to claim 1:
   wherein the plurality of plant simulators have an active plant simulator that spontaneously determined state and a passive plant simulator where a timing is determined on a processor emulator side;
   wherein the computer implemented simulation system comprises a plurality of external peripheral schedulers: and
   wherein the computer implemented simulation system further comprises at least one of an external peripheral scheduler for an active plant that communicates with the active plant simulator and at least one of an external peripheral scheduler for a passive plant that communicates with the passive plant simulator.

6. The simulation system according to claim 1, further comprising control area network (CAN) emulator, wherein the CAN emulator is scheduled by the mutual peripheral scheduler.

7. The simulation system according to claim 1, wherein each of the processor emulators operates in conjunction with an internal peripheral scheduler with a queue, and shared memory access deadlock by the plurality of processor emulators is avoided based on the times for the write events in the queue.

8. A computer implemented simulation method that performs simulation, comprising:
   executing a plurality of processor emulators on a computer;
   executing a plurality of plant simulators on the computer;
   executing an external peripheral scheduler on the computer, wherein executing an external peripheral scheduler (i) first runs a plant simulator until a reaction delay time of a processor emulator, and (ii) provides notification through a peripheral emulator to run the plant simulator before the processor emulator until a simulator stop time; and
   executing a mutual peripheral scheduler that runs on the computer and provides notification for running in advance of the processor emulator only for a communication delay time with the processor emulator, wherein the processor emulator conservatively proceeds until a notification time.

9. The simulation method according to claim 8, wherein the computer is a multitask system, and the plurality of processor emulators, the plurality of plant simulators, the external peripheral scheduler, and the mutual peripheral scheduler are executed as individual threads or processes.

10. The simulation method according to claim 9, wherein the computer is a multicore or multiprocessor system, and the plurality of processor emulators, the plurality of plant simulators, the external peripheral scheduler, and the mutual peripheral scheduler are executed as individual threads or processes assigned to individual processors or cores that differ from the multiprocessor system.

11. The simulation method according to claim 10, wherein the plant simulator and the peripheral emulator that communicates with the plant simulator are assigned to a same core or processor.

12. The simulation method according to claim 8:
wherein the plurality of plant simulators have an active plant simulator that spontaneously determined state, and a passive plant simulator where a timing is determined on a processor emulator side;
wherein the method comprises executing a plurality of external peripherals: and
wherein the method comprises executing at least one of an external peripheral scheduler for an active plant that communicates with the active plant simulator, and executing at least one of an external peripheral scheduler for a passive plant that communicates with the passive plant simulator.

13. The simulation method according to claim 8, further comprising a step of executing a control area network (CAN) emulator, wherein the CAN emulator is scheduled by the mutual peripheral scheduler.

14. The simulation method according to claim 8, wherein each of the processor emulators operates in conjunction with an internal peripheral scheduler with a queue, and shared memory access deadlock by the plurality of processor emulators is avoided based on the times for the write events in the queue.

15. A non-transitory computer readable storage medium tangibly embodying a computer readable program code having computer readable instructions which, when implemented, cause a computer to carry out the steps of a method comprising:
executing a plurality of processor emulators;
executing a plurality of plant simulators;
executing an external peripheral scheduler and first running a plant simulator until a reaction delay time of a processor emulator, and providing notification through a peripheral emulator to run the plant simulator before the processor emulator until a simulator stop time; and
executing a mutual peripheral scheduler that runs on the computer and provides notification for running in advance of the processor emulator only for a communication delay time with the processor emulator;
wherein the processor emulator performs conservative processing until a notification time.

16. The computer readable storage medium according to claim 15, wherein the computer is a multitask system, and the plurality of processor emulators, the plurality of plant simulators, the external peripheral scheduler, and the mutual peripheral scheduler are executed as individual threads or processes.

17. The computer readable storage medium according to claim 16, wherein the computer is a multicore or multiprocessor system, and the plurality of processor emulators, the plurality of plant simulators, the external peripheral scheduler, and the mutual peripheral scheduler are executed as assigned individual threads or processes assigned to individual processors or cores that differ from the multiprocessor system.

18. The computer readable storage medium according to claim 17, wherein the plant simulator and the peripheral emulator that communicates with the plant simulator are assigned to a same core or processor.

19. The computer readable storage medium according to claim 15:
wherein the plurality of plant simulators have an active plant simulator that spontaneously determined state, and a passive plant simulator where a timing is determined on a processor emulator side;
wherein the method comprises executing a plurality of external peripherals: and
wherein the method further comprises executing at least one of an external peripheral scheduler for an active plant that communicates with the active plant simulator, and executing at least one of an external peripheral scheduler for a passive plant that communicates with the passive plant simulator.

20. The computer readable storage medium according to claim 15, further comprising a step of executing a control area network (CAN) emulator, wherein the CAN emulator is scheduled by the mutual peripheral scheduler.

21. The computer readable storage medium according to claim 15, wherein each of the processor emulators operates in conjunction with an internal peripheral scheduler with a queue, and shared memory access deadlock by the plurality of processor emulators is avoided based on the times for the write events in the queue.

* * * * *